(12) United States Patent
Kierse et al.

(10) Patent No.: US 9,661,408 B2
(45) Date of Patent: *May 23, 2017

(54) PACKAGES AND METHODS FOR PACKAGING

(71) Applicant: Analog Devices, Inc., Norwood, MA (US)

(72) Inventors: Oliver J. Kierse, Killaloe (IE); Christian Lillelund, Fredensborg (DK)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/880,140

(22) Filed: Oct. 9, 2015

(65) Prior Publication Data

US 2016/0105737 A1 Apr. 14, 2016

Related U.S. Application Data

(63) Continuation of application No. 13/662,350, filed on Oct. 26, 2012, now Pat. No. 9,156,680.

(51) Int. Cl.
*H04R 9/08* (2006.01)
*H04R 1/02* (2006.01)
(Continued)

(52) U.S. Cl.
CPC ............ *H04R 1/02* (2013.01); *B81B 7/007* (2013.01); *B81B 7/0061* (2013.01);
(Continued)

(58) Field of Classification Search
CPC . H01L 2224/48091; H01L 2924/13062; H01L 2924/00; H01L 2924/00014;
(Continued)

(56) References Cited

U.S. PATENT DOCUMENTS 4,575,330 A 3/1986 Hull
4,752,352 A 6/1988 Feygin
(Continued)

FOREIGN PATENT DOCUMENTS

WO WO 2007/129787 11/2007
WO WO 2011/103720 9/2011

OTHER PUBLICATIONS

Chait et al. "Custom Designed Microstructures Using Metamaterials," Antenna Systems & Technology Magazine and Conference, World Wide Web Address: antennasonline.com/eprints/EoPlex_Sept10.html; accessed Aug. 24, 2012.
(Continued)

*Primary Examiner* — Mohammed Shamsuzzaman
(74) *Attorney, Agent, or Firm* — Knobbe, Martens, Olson & Bear LLP

(57) ABSTRACT

A three-dimensional printing technique can be used to form a microphone package. The microphone package can include a housing having a first side and a second side opposite the first side. A first electrical lead can be formed on an outer surface on the first side of the housing. A second electrical lead can be formed on an outer surface on the second side of the housing. The first electrical lead and the second electrical lead may be electrically shorted to one another. Further, vertical and horizontal conductors can be monolithically integrated within the housing.

20 Claims, 16 Drawing Sheets

(51) Int. Cl.
*B81B 7/00* (2006.01)
*H01L 29/84* (2006.01)
*H01L 23/053* (2006.01)

(52) U.S. Cl.
CPC . *B81B 2201/0257* (2013.01); *B81B 2207/092* (2013.01); *H01L 23/053* (2013.01); *H01L 29/84* (2013.01); *H01L 2224/48091* (2013.01); *H01L 2224/48137* (2013.01); *H01L 2224/48227* (2013.01); *H01L 2924/13062* (2013.01); *H01L 2924/1461* (2013.01); *H04R 2201/003* (2013.01)

(58) Field of Classification Search
CPC . H01L 2224/48137; H01L 2224/48227; H01L 23/053; H01L 2924/1461; H01L 29/84; B81B 2201/0257; B81B 2207/092; B81B 7/0061; B81B 7/007; H04R 1/02; H04R 2201/003
USPC ............... 381/355; 257/415, 783, 737, 704; 438/118, 122; 361/704; 29/837
See application file for complete search history.

(56) References Cited

U.S. PATENT DOCUMENTS

| | | | |
|---|---|---|---|
| 4,863,538 | A | 9/1989 | Deckard |
| 5,313,365 | A | 5/1994 | Pennisi et al. |
| 5,348,693 | A | 9/1994 | Taylor et al. |
| 5,870,482 | A | 2/1999 | Loeppert et al. |
| 6,781,231 | B2 | 8/2004 | Minervini |
| 7,202,552 | B2 | 4/2007 | Zhe et al. |
| 7,242,089 | B2 | 7/2007 | Minervini |
| 7,255,551 | B2 | 8/2007 | Taylor et al. |
| D575,056 | S | 8/2008 | Tan |
| 8,115,283 | B1* | 2/2012 | Bologna .............. B81B 7/0064 257/659 |
| 8,199,939 | B2 | 6/2012 | Suvanto et al. |
| 8,300,870 | B2 | 10/2012 | Lee et al. |
| 8,502,329 | B2* | 8/2013 | Hsieh .................. H01G 5/18 257/419 |
| 8,625,832 | B2 | 1/2014 | Lillelund |
| 9,156,680 | B2 | 10/2015 | Kierse et al. |
| 2005/0189622 | A1* | 9/2005 | Humpston ............ B81B 7/0077 257/659 |
| 2007/0053504 | A1 | 3/2007 | Sato et al. |
| 2007/0071268 | A1 | 3/2007 | Harney et al. |
| 2007/0082421 | A1* | 4/2007 | Minervini ............ B81B 7/0064 438/50 |
| 2007/0202627 | A1 | 8/2007 | Minervini |
| 2007/0278601 | A1 | 12/2007 | Goodelle et al. |
| 2008/0075309 | A1 | 3/2008 | Chen et al. |
| 2008/0079142 | A1* | 4/2008 | Carmona ............ B81C 1/00333 257/704 |
| 2008/0175425 | A1 | 7/2008 | Roberts et al. |
| 2008/0217766 | A1 | 9/2008 | Minervini |
| 2008/0304681 | A1 | 12/2008 | Langlois et al. |
| 2009/0200620 | A1 | 8/2009 | Omura et al. |
| 2009/0202089 | A1 | 8/2009 | Zhang et al. |
| 2009/0320698 | A1 | 12/2009 | LaPerna Wong |
| 2010/0009133 | A1* | 1/2010 | Chait .................. B29C 67/0059 428/195.1 |
| 2010/0055895 | A1 | 3/2010 | Zafiropoulo et al. |
| 2010/0086146 | A1 | 4/2010 | Gong et al. |
| 2010/0090295 | A1 | 4/2010 | Zhe et al. |
| 2010/0142744 | A1 | 6/2010 | Rombach et al. |
| 2010/0155863 | A1 | 6/2010 | Weekamp |
| 2011/0198714 | A1 | 8/2011 | Yang |
| 2011/0293126 | A1* | 12/2011 | Maekawa ............ H04R 19/005 381/355 |
| 2012/0237073 | A1 | 9/2012 | Goida et al. |
| 2012/0250925 | A1 | 10/2012 | Lillelund |
| 2012/0321111 | A1 | 12/2012 | Lillelund |
| 2013/0105952 | A1* | 5/2013 | Fontana ................ B81B 7/0064 257/659 |

OTHER PUBLICATIONS

Chait, "High[ Volume Print Forming, Hvpftm a New Method for Manufacturing Large vols. Of Complex Metal[ Ceramic and Hybrid Components," World Wide Web Address: eoplex.com/images/eoplex_whitepaper_hvpf.pdf, accessed Aug. 24, 2012.

Chait, "Solving the Last Milli[Mile' Problem in Vehicle Safety; The EoPlex Approach to Powering Wireless Tire Pressure Sensors," World Wide Web Address: eoplex.com/images/eoplex_whitepaper_tire.pdf, accessed Aug. 24, 2012.

Hosiden, "Guide for Electret Condenser Microphones," World Wide Web Address: es.co.th/schemetic/pdf/KUC.pdf, accessed Aug. 24, 2012.

Kanellos, "How Do You Make a Fuel Cell? Print it," CNET News, World Wide Web Address: news.cnet.com/How-do-you-make-a-fuel-cell-Print-it/2100-1008_3-6078124.html?tag=sas.email; accessed Aug. 24, 2012.

Open Music Labs, "Electret Microphones," World Wide Web Address: openmusiclabs.com/learning/sensors/electret-microphones/, accessed Aug. 24, 2012.

Rogren et al., "A High Performance and Cost Effective Molded Array Package Substrate," World Wide Web Address: eoplex.com/QFP_MR_White_Paper.pdf, accessed Aug. 24, 2012.

Taylor et al, "'Spatial Forming' A Three Dimensional Printing Process," World Wide Web Address: eoplex.com/images/eoplex_whitepaper_3dprinting.pdf, accessed Aug. 24, 2012.

\* cited by examiner

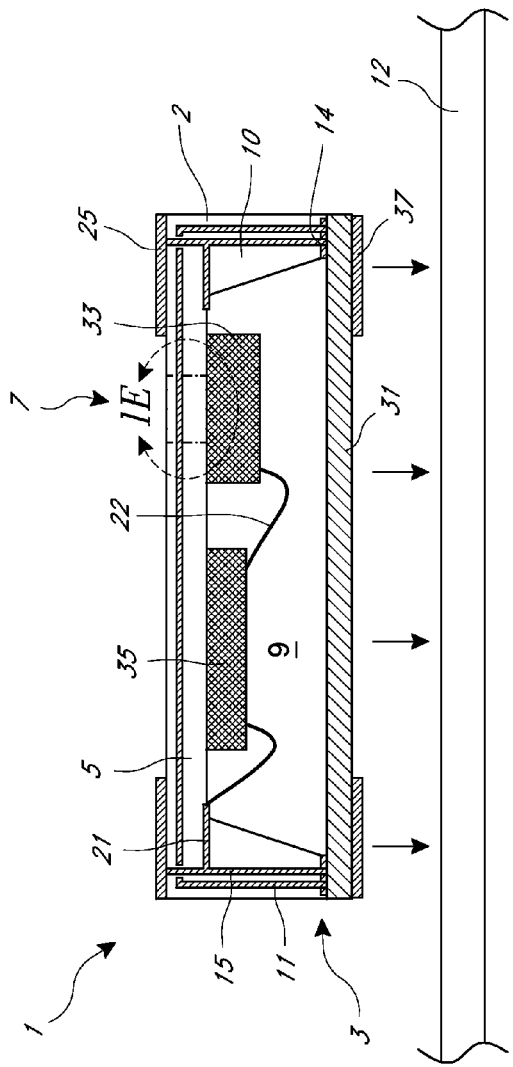
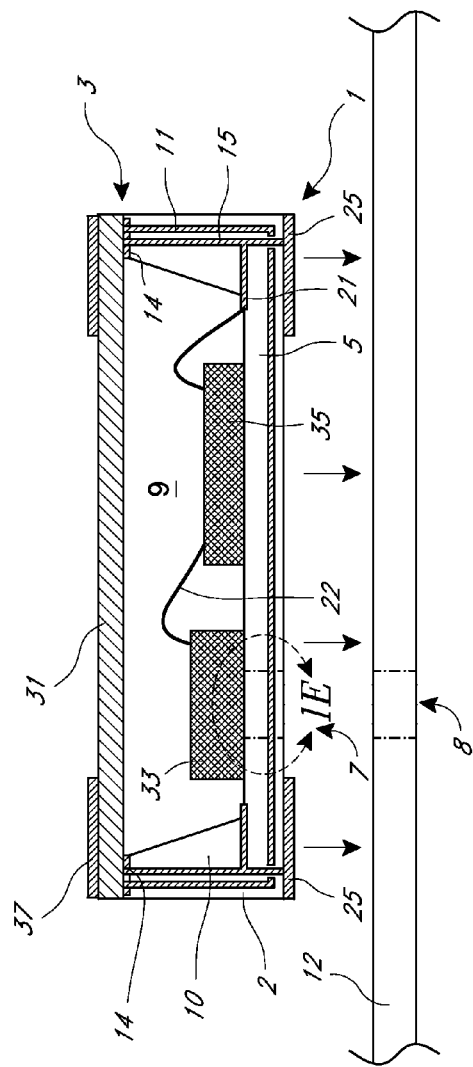
FIG. 1A
FIG. 1B

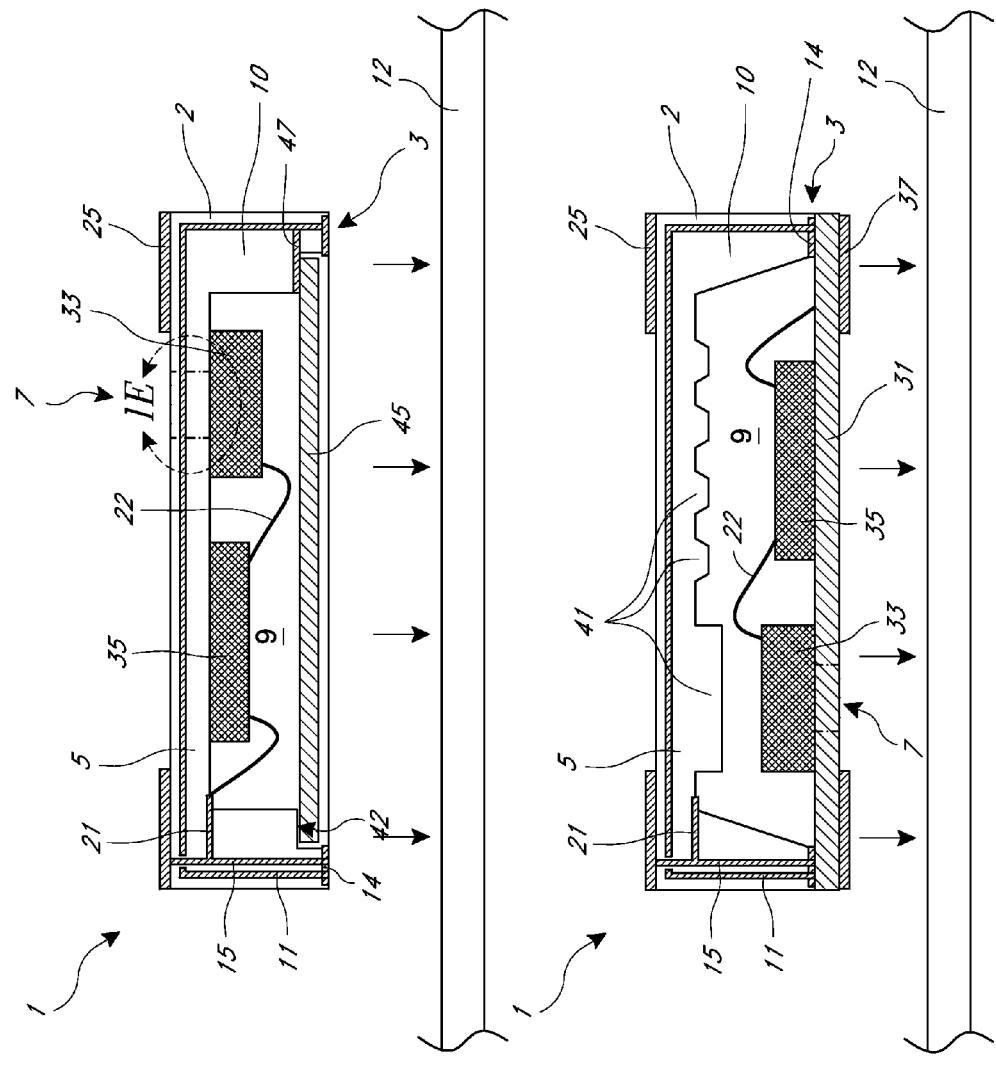

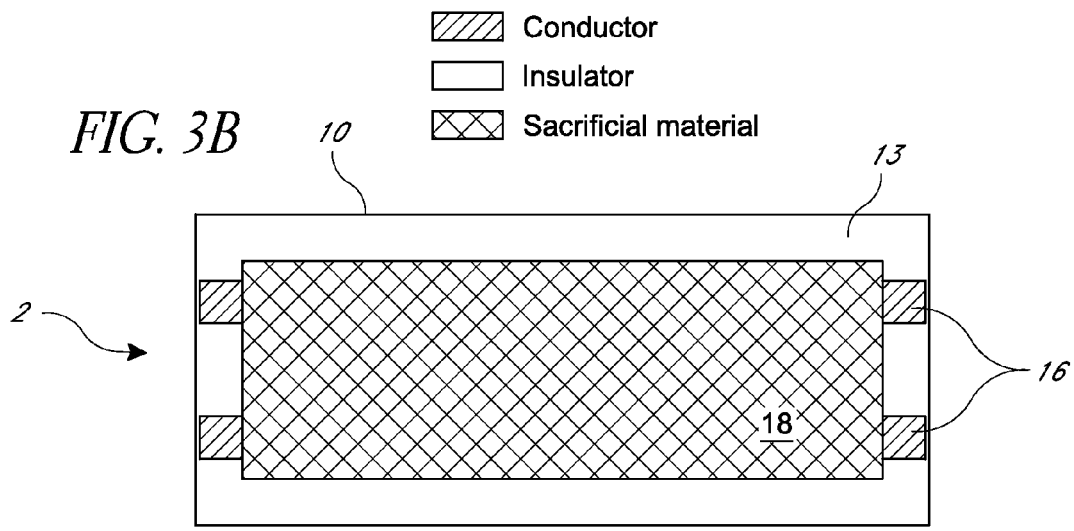
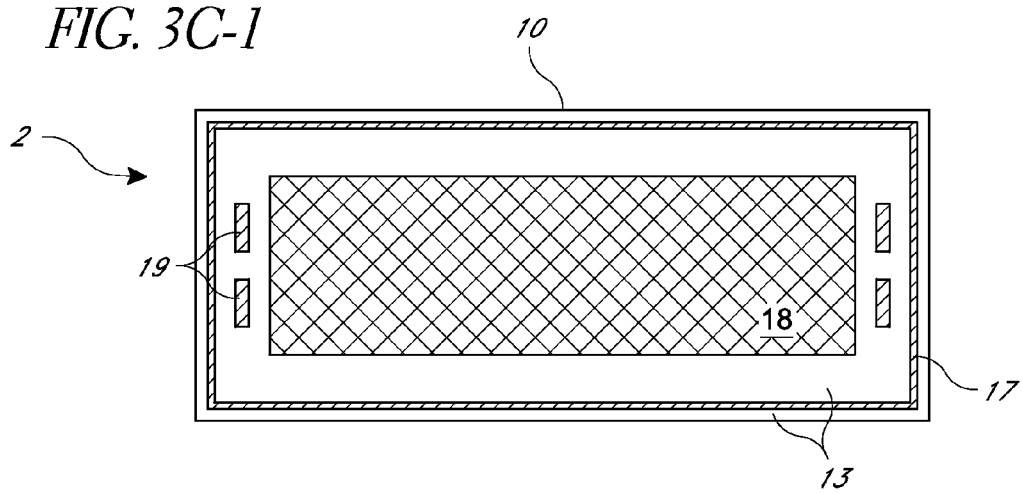
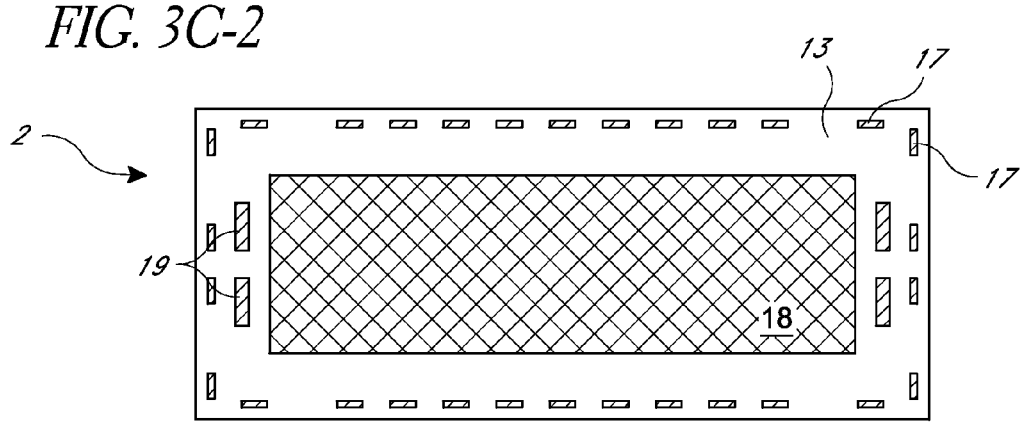

| ▨ | Conductor |
| --- | --- |
| ☐ | Insulator |
| ▩ | Sacrificial material |

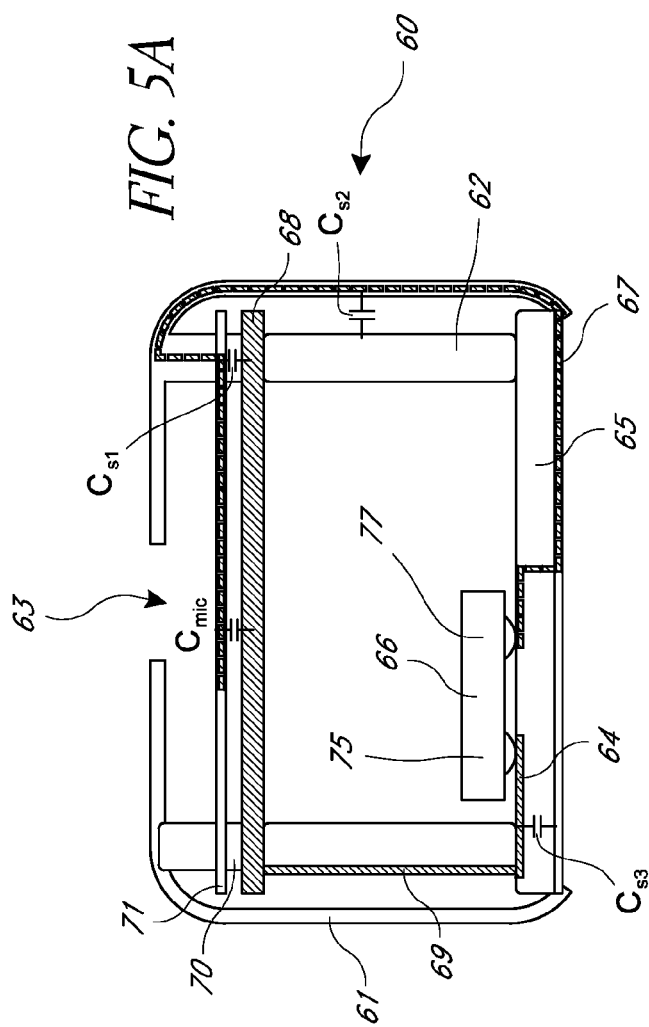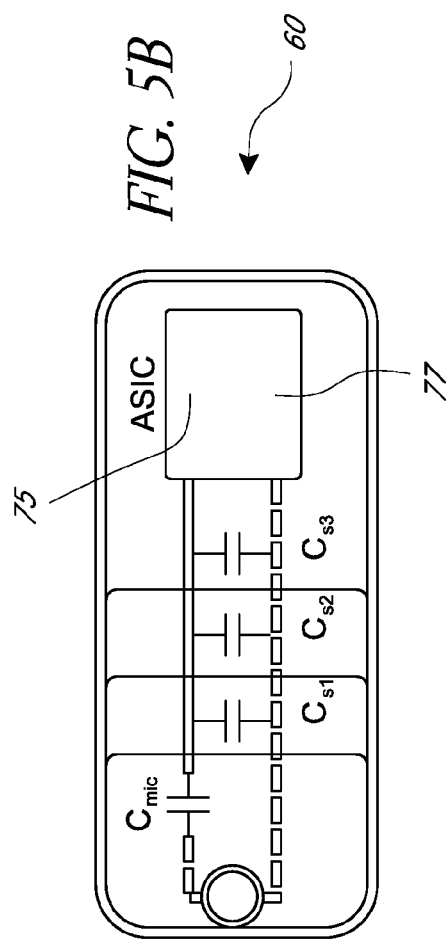

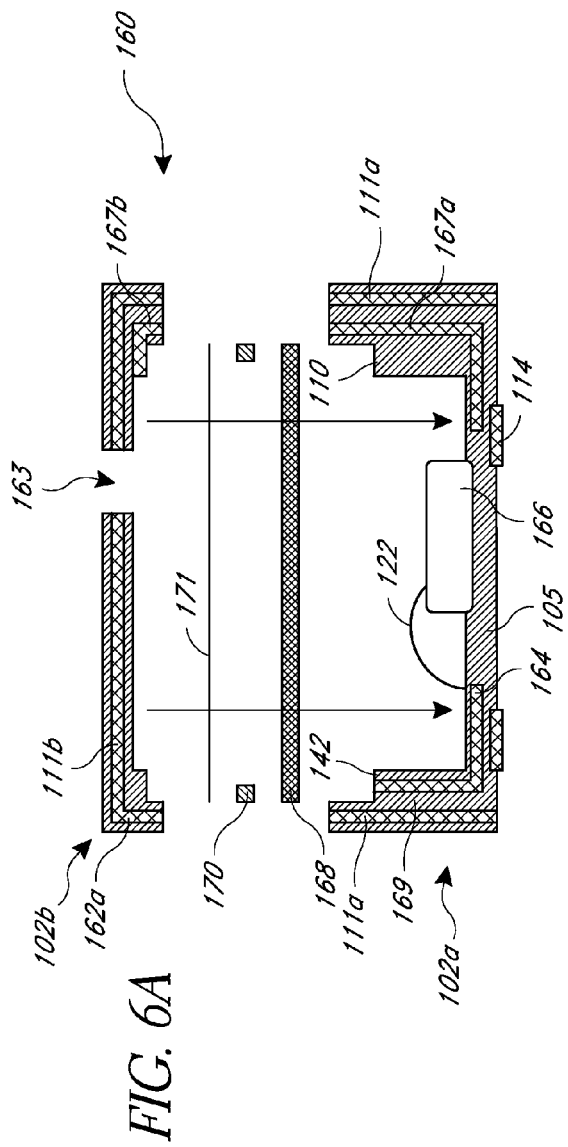
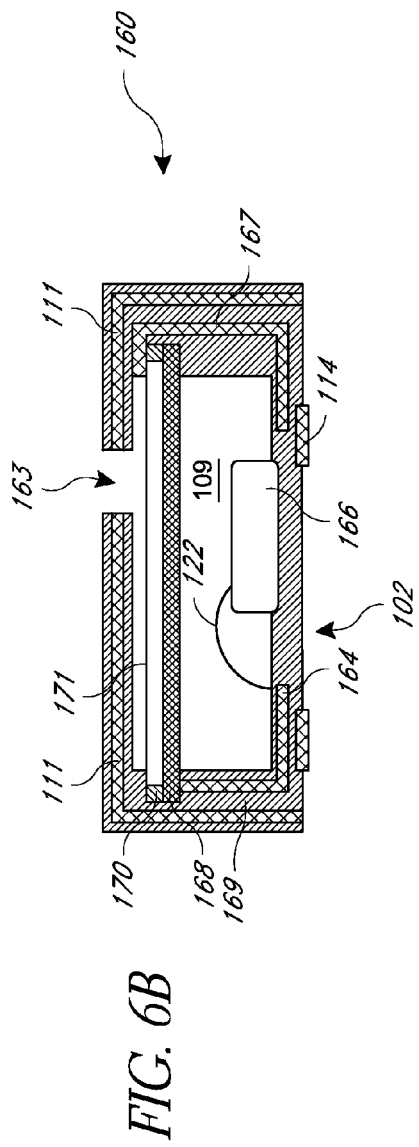
FIG. 6A
FIG. 6B

PACKAGES AND METHODS FOR PACKAGING

CROSS-REFERENCE TO RELATED APPLICATIONS

This application is a continuation of U.S. patent application Ser. No. 13/662,350, filed Oct. 26, 2012, which is incorporated by reference herein in its entirety and for all purposes.

BACKGROUND OF THE INVENTION

Field of the Invention

The field relates to integrated devices and methods for packaging the same. More particularly, the field relates to packaging of integrated devices.

Description of the Related Art

Integrated device dies, such as microphone dies and processor dies, are often secured within a package for environmental protection, to provide acoustic back volume (in the case of microphone dies) and to aid in connecting the die to a larger circuit. Various package arrangements may utilize multiple conductors to electrically connect package components and/or to shield the package from external radio frequency (RF) interference (also referred to herein as electromagnetic interference, or EMI). Furthermore, some packages may include one or more cavities, voids, or holes for various purposes, such as, e.g., sound ports and back volume cavities in microphone packages. It should be appreciated that in advanced packaging arrangements, it can be difficult to form conductors and cavities at desired and/or arbitrary locations within the package.

More generally, integrated device packages, whether for acoustic or other types of devices, can be mounted in various orientations, depending upon the configuration of the larger system in which the packages are to be mounted. It can be expensive to redesign packages for various mounting configurations.

There is therefore a need for improved packaging arrangements and techniques for integrated device packages.

SUMMARY

In one embodiment, an integrated device package is disclosed. The integrated device package can include a first housing. The first housing can comprise a base and a wall extending from the base, the wall having a distal end portion and a proximal end portion integral with the base. The first housing can also include a first conductor and a second conductor, the first conductor and the second conductor each extending from the base to the distal end portion of the wall. At least the base, the wall, the first conductor, and the second conductor can be monolithically integrated.

In another embodiment, an integrated device package is disclosed. The integrated device package can include a housing having a first side and a second side opposite the first side. Further, the housing can comprise a first electrical lead formed on an outer surface on the first side of the housing. The housing can also have a second electrical lead formed on an outer surface on the second side of the housing. The first electrical lead and the second electrical lead can be electrically shorted to one another.

In yet another embodiment, a method for forming an integrated device package is disclosed. The method can comprise forming a first housing by employing a three-dimensional (3D) printing technique to form a non-conductive base having a plurality of integrated horizontal conductors and a non-conductive wall having a plurality of integrated vertical conductors. The wall can extend from the base.

In another embodiment, a method for packaging an integrated device is disclosed. The method can include providing a housing having a first side and a second side opposite the first side. A first electrical lead can be formed on an outer surface on the first side of the housing. A second electrical lead can be formed on an outer surface on the second side of the housing. The first and second electrical leads can be electrically shorted to one another. The method can further comprise mounting an integrated device die to the housing. In addition, the method can include electrically coupling the integrated device die to the housing.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These aspects and others will be apparent from the following description of preferred embodiments and the accompanying drawing, which is meant to illustrate and not to limit the invention, wherein:

FIGS. 1A and 1B are side cross-sectional views of a reversible microphone package, according to one embodiment, shown in top port and bottom port orientations, respectively.

FIG. 1C is a side cross-sectional view of a reversible top and bottom port microphone package having a recessed lid, according to another embodiment.

FIG. 1D is a side cross-sectional view of a reversible top and bottom port microphone package that includes acoustic structures for modulating the propagation of acoustic waves, according to yet another embodiment.

FIGS. 3B-3G are horizontal cross-sectional views of the housing body shown in FIG. 3A at various vertical positions, which can also represent various stages of a three-dimensional (3D) printing technique.

FIG. 5A is a schematic, side cross-sectional view of an electret condenser microphone package.

FIG. 5B is a schematic diagram of a circuit that is equivalent to the microphone package of FIG. 5A.

FIG. 6A is an exploded, side cross-sectional view of a microphone package, according to another embodiment.

FIG. 6B is an assembled, side cross-sectional view of the microphone package of FIG. 6A.

DETAILED DESCRIPTION

Figure 1E:
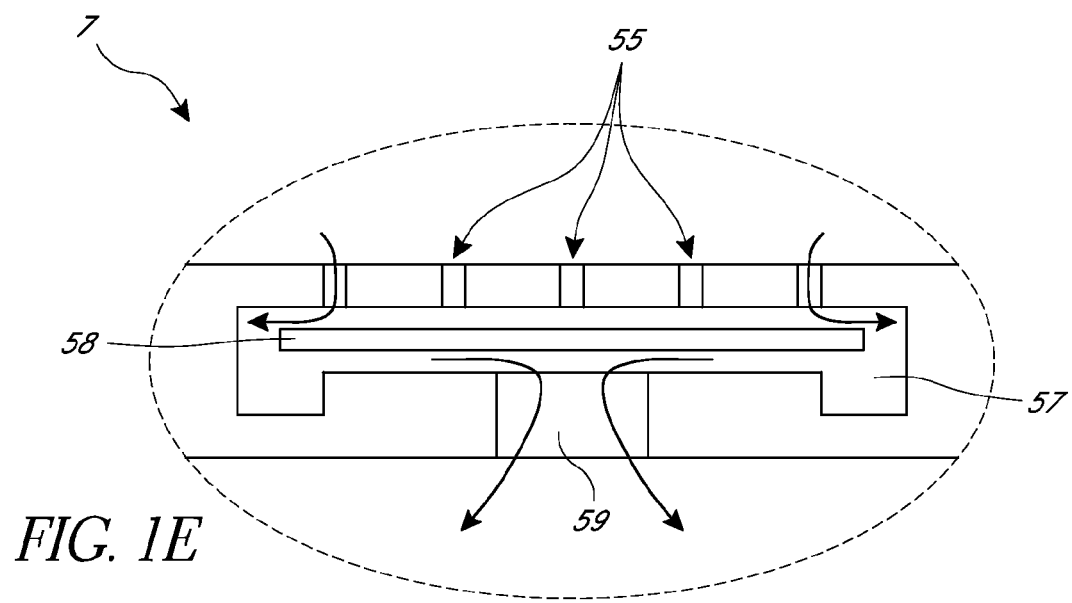
FIG. 1E is a magnified side cross-sectional view of a sound port that can be employed in the packages of FIGS. 1A-1C.

An integrated device (such as a microphone device, an integrated circuit, and the like) may be packaged in a housing in order to protect the integrated device from the outside environment and to provide an interface to an external circuit or system, e.g., a motherboard coupled to a larger system. To adequately protect the integrated device from the outside environs and to provide a robust interface to the external system that fully meets the system requirements, the package housing may incorporate various structures and interconnects having a multitude of shapes, sizes, configurations, and materials. In advanced packaging schemes, it can be advantageous to be able to form structures, recesses, and cavities having complex, arbitrary geometries and made from a large set of materials, including metals, ceramics, and polymers.

Depending on the functionality of the integrated device, it may be desirable to incorporate conductive wires and/or sheets along surfaces of and/or embedded within the package housing. For example, conductive wires may be used as signal traces connecting various components of the package. Conductive sheets or wire segments may be employed to shield the package from electromagnetic interference (EMI). Conductive leads may be formed on outer surfaces of the package to electrically and/or mechanically couple to the external system (e.g., motherboard).

The package housing may also include one or more holes or apertures formed through a wall of the housing. For example, in optical device packages, a port or a window can be provided to provide optical communication to the packaged device. Similarly, in acoustic packages, such as microphone packages, a sound port hole may be formed through the housing to provide fluid communication between the outside environs and the microphone components. Further, in some arrangements, it may be desirable to form one or more cavities or recesses within the package housing such as, e.g., a backvolume cavity for a microphone device. In addition, in some arrangements for microphone packages, it can be desirable to form acoustic structures with arbitrary and complex geometries configured to modulate the acoustic wave as it propagates within the package, or to filter out debris that may enter the package. The package housing may also include various structural components such as internal ledges and mounting surfaces to support various components.

Accordingly, various embodiments of packages are disclosed herein that include arbitrary and complex geometries formed from a large set of materials. One method of forming these geometries is by using various 3D printing technologies, as disclosed herein.

Reversible Top and Bottom Port Packages

One example of a packaged integrated device is a microphone package. There are various types of microphone packages, including, e.g., microelectromechanical systems (MEMS) microphone packages and electret condenser microphone (ECM) packages. Microphone packages can typically include a package housing having a sound port formed therethrough to allow for the ingress of sound waves into the package. Similarly, other types of packages may benefit from a communication port in the package, such as gas sensors, pressure sensors, optical sensors, or optical emitters. Typically, a bottom side of the package can be mounted to an external system, such as a system substrate or motherboard (e.g., a printed circuit board, or PCB). Note that the use of "top" and "bottom" herein is for ease of illustration and reference only and should not be read as requiring a particular spatial orientation.

The port can be formed in any suitable surface of the housing, including, e.g., a top side or the bottom side of the package housing. In other embodiments, the port can be formed through a side wall of the housing. When the port is located on a top side of the package opposite the system substrate, the package can be referred to as a top port package. Similarly, when the port is located on a bottom side of the package facing the system substrate, the package can be referred to as a bottom port package. In some bottom port packages, the system substrate or motherboard can also include a port hole to permit communication (e.g., sound waves, gases, optical signals, etc.) through both the system substrate and the bottom port formed in the package housing.

In some arrangements, it can be advantageous to provide a package configured to be either a top port package or a bottom port package, also referred to herein as a reversible top and bottom port package, or a reversible package. In conventional packages, for example, the package manufacturer or assembler makes packages that are tailored to function as only a top port package or as only a bottom port package. In such conventional packages, the manufacturer, assembler or customer typically decides whether to use a top or bottom port package before production, and the manufacturer or assembler designs and produces a package tailored to the specific arrangement by making a package that functions only as a top port package or only as a bottom port package.

By contrast, with a reversible top and bottom port package, the package manufacturer or assembler can implement a package without regard to whether the port is ultimately integrated into the larger system on the top side of the package facing away from the system substrate, or on the bottom side of the package facing the system substrate. Thus, reversible packages allow for the design and assembly of a package that can be used in a variety of applications, permitting the end user or customer to decide whether the package will be used as a top port package or a bottom port package. For example, one end user may use a package as a top port package, while a second end user may use the same package as a bottom port package. The reversible package designs therefore give the end user more flexibility when faced with the decision of how to integrate the package into the larger system.

While the examples provided herein relate to various microphone package applications, the skilled artisan will appreciate that the principles and advantages taught herein are applicable to non-acoustic packages.

FIGS. 1A and 1B are side cross-sectional views of a reversible top and bottom port microphone package 1, according to one embodiment. The package 1 in FIGS. 1A and 1B can be identically formed, however, the package 1 in FIG. 1A is shown in a top port orientation, e.g., the side of the package 1 to be mounted to a system substrate 12 or motherboard is opposite the side of the package through which a sound port 7 is formed. By contrast, the package 1 in FIG. 1B is shown in a bottom port orientation, e.g., the side of the package 1 to be mounted to the system substrate 12 is the same side through which the sound port 7 is formed. In the bottom port orientation of FIG. 1B, the mounting board or system substrate 12 can also include a port hole 8 configured to allow sound waves to pass through both the system substrate 12 and the package 1.

The package 1 can include a package housing 3. The housing 3 can comprise a housing body 2 and a package substrate 31, which may in some aspects be referred to as a lid. As shown in FIGS. 1A and 1B, for example, the package substrate 31 can act as a lid to at least substantially enclose the housing body 2 and to form a cavity 9 within the package housing 3. In the embodiment illustrated in FIGS. 1A and 1B, the housing body 2 can be formed from an insulating material and can include one or more conductors formed on surfaces of, or embedded within, the housing body 2. Further, the housing body 2 can be formed with one or more cavities, holes, or recesses formed therein. As explained in more detail below, the housing body 2 can be made using a three-dimensional (3D) printing technique such that the body's conductors and insulators can be monolithically integrated.

The package housing 3 can be formed by coupling the package substrate 31 (or alternatively, a lid) to the housing body 2. For example, the package substrate 31 can be coupled to the housing body 2 using an adhesive or by soldering. The package substrate 31 can be any suitable substrate, including, e.g., a printed circuit board (PCB) substrate, a ceramic substrate, or a metal substrate, such as a molded leadframe. The package substrate 31 shown in FIGS. 1A and 1B can include conductive paths, such as internal conductive traces, to route signals received from the components within the package 1. In other embodiments, such as the embodiment of FIG. 1C described below, a simple planar lid can also be employed to substantially enclose the housing body 2.

One or more integrated devices can be mounted within the cavity 9 formed in the package housing 3. For example, a microphone die 33 can be mounted on an interior surface of the housing 3 over the sound port 7. In some embodiments, the microphone die 33 can be a MEMS microphone die, however skilled artisans would appreciate that other types of microphone dies are possible. As shown in FIGS. 1A and 1B, the microphone die 33 can be mounted on an interior surface of the housing body 2, however, in other embodiments, the microphone die 33 can be mounted on an interior surface of the package substrate 31.

Further, a processor die 35 can also be mounted on an interior surface of the housing 3. While illustrated as being mounted on the interior surface of the housing body 2, the processor die 35 can alternatively be mounted on the interior surface of the package substrate 31, independently of where the microphone die 33 is mounted. The microphone die 33 can be electrically coupled to the processor die 35. As shown in FIGS. 1A and 1B, the microphone die 33 can electrically connect to the processor die 35 by way of the bonding wires 22. Alternatively, the two dies can communicate through traces in the package housing 3. It will be understood that the dies 33, 35 can be in electrical communication with traces of the package housing 3 through bond wires, as shown, or through flip-chip connections (e.g., solder balls, anisotropic conductive film, non-conductive paste, etc.).

In operation, sound waves can enter the package 1 through the sound port 7. The incoming sound waves can cause a membrane within the microphone die 33 to vibrate. The cavity 9 can act as a backvolume cavity for the package 1. The vibrating membrane and a backplate within the die 33 can create a changing capacitance. The changing capacitance can be converted to electrical signals that can be transmitted to the processor die 35 by way of the bonding wires 22. The processor die 35 can process the electrical signals received from the microphone die 33, and can transmit the processed data to the external system by way of bonding wires 22 coupled to an electrical contact pad 21 formed on the interior surface of the package housing 3. As explained herein, the electrical contact pad 21 can be connected by way of internal traces and wires to electrical leads 25 and 37 formed on outer surfaces of the housing 3. Moreover, the dies can electrically communicate with traces in the package housing 3 through connections other than bonding wires.

The housing body 2 can include a base 5 and a wall 10 extending from the base 5. The wall 10 can include a proximal portion integrally formed with the base 5 and a distal portion opposite the proximal portion. One or more electrical conductors can extend from the base 5 to the distal end portion of the wall.

In some embodiments, an electrically conductive shielding layer 11 can be formed within the housing body 2. As shown in FIGS. 1A and 1B, the shielding layer 11 can be embedded within the body 2 and can extend through the base 5 and the wall 10. The shielding layer 11 can thereby substantially enclose the microphone die 33 and other components in the cavity 9. The shielding layer 11 can be a continuous layer or a web of lines that act as a Faraday cage to isolate the package 1 from unwanted electromagnetic interference (EMI) that can disrupt signals detected by the microphone package 1. As noted, the shielding layer 11 can be formed as a conductive sheet or as a mesh that includes a matrix of metallic segments formed in the housing body 2. The shielding layer 11 can also include openings or apertures therein (or voids within the mesh) that allow signal wires to pass through the shielding layer 11 without shorting to the shielding layer 11. In some embodiments, the shielding layer 11 can electrically couple to ground by way of one or more of the leads 37 and/or 25.

As shown in FIGS. 1A and 1B, an electrically conductive wire 15 can extend from the proximal portion of the wall 10 to the distal portion of the wall 10. As shown, at least a portion of the wire 15 can be embedded within the wall 10 and/or the base 5. A proximal portion of the wire 15 can be formed as the electrical contact pad 21 that extends at least partially along an interior surface of the housing 3 into the cavity 9. The electrical contact pad 21 can be configured to electrically communicate with one or more integrated device dies positioned within the cavity 9 of the housing 3, such as, e.g., the processor die 35 and/or the microphone die 33. For example, electrical bonding wires 22 can be soldered or otherwise electrically coupled to the contact pad 21. For flip-chip connected dies, the wire can connect to bond pads under the dies. A distal portion of the wire 15 can be formed as an electrical interface 14. As shown in FIGS. 1A and 1B, the electrical interface 14 can electrically couple to the package substrate 31, and ultimately to one or more leads 37 on the outer surface of the package substrate 31 by way of conductive traces (not shown) within the package substrate 31. Furthermore, the wire 15 can also extend through the base 5 to electrically couple to one or more leads 25 formed on an outer surface of the housing body 2. As shown in FIGS. 1A and 1B, the wire 15 can pass through an opening in the electrically conductive shielding layer 11 to couple to the lead 25.

Thus, signals processed by the processor die 35 can be transmitted to the electrical contact pad 21 by way of the bonding wires 22. The signals can then be transmitted through the wire 15 to both the electrical interface 14 formed in the distal portion of the wall 10 and to the lead 25 formed on the outer surface of the housing body 2. The signal can also pass from the electrical interface 14 through the package substrate 31 to the leads 37 formed on the outer surface of the package substrate 31. As explained above, traces within the package substrate 31 can electrically connect the interface 14 with the leads 37.

Because the signal from the processor 35 is transmitted to both the lead 37 on the outer surface of the package substrate 31 and the lead 25 on the outer surface of the housing body 2, the two leads 25 and 37 on opposing sides of the package 1 may be electrically shorted to one another. As a result, the same electrical signal can be transmitted to both the lead 25 on the outer surface of the housing body 2 and the lead 37 on the outer surface of the package substrate 31. Thus, either lead 25 or 37 can be coupled to the system substrate 12, which enables the package 1 to be either a top port microphone package (e.g., as in the configuration of FIG. 1A) or a bottom port microphone package (e.g., as in the configuration of FIG. 1B).

In the illustrated embodiments, the base 5, the wall 10, the wire 15, and the shielding layer 11 can be monolithically integrated or formed. As explained below, in some implementations, the base 5, the wall 10, the wire 15, and the shielding layer 11 can be sintered together. Various materials can be used in the package 1 shown in FIGS. 1A and 1B, including conductive materials like metals and non-conductive materials like polymers or ceramics. As explained below, the package 1 in FIGS. 1A and 1B can be formed using a 3D printing technique.

Turning to FIG. 1C, another embodiment of a reversible microphone package is disclosed. Like reference numerals may be used to reference components similar to or the same as those described with respect to FIGS. 1A and 1B. The package 1 of FIG. 1C is similar to the package of FIGS. 1A and 1B. However, while the embodiments of FIGS. 1A and 1B used a package substrate 31 to enclose the cavity 9, the embodiment of FIG. 1C employs a recessed lid 45 mounted on a ledge 42 formed in the distal end portion of the wall 10. The lid 45 can provide a lower profile package 1 than packages employing the package substrate 31 (e.g., as in FIGS. 1A and 1B). Further, while the leads 37 were located on the outer surface of the package substrate 31 in FIGS. 1A and 1B, in FIG. 1C, the electrical interface 14 can act as an electrical lead. Thus, as in FIGS. 1A and 1B, the package 1 of FIG. 1C is also a reversible microphone package, because either the lead 25 on the outer surface of the housing body 2 or the electrical interface 14 at the distal portion of the wall 10 can couple to the system substrate or motherboard. In implementations where the electrical interface 14 couples to the system substrate, the electrical interface 14 can be considered a lead. In addition, in some embodiments, an electrical contact 47 can be formed on the ledge 42 in order to electrically communicate with the lid 45, such as, e.g., to ground the shielding layer 11. In the embodiment of FIG. 1C, all traces are formed within the integrated housing body 2, while the lid 45 can be a simple conductive or non-conductive plate.

FIG. 1D is a side cross-sectional view of a reversible top and bottom port microphone package that includes acoustic structures, according to yet another embodiment. Like reference numerals may be used to reference components similar to or the same as those described with respect to FIGS. 1A and 1B. Unlike the embodiments shown in FIGS. 1A and 1B, the package 1 of FIG. 1D includes multiple acoustic structures 41 formed in the housing body 2. The acoustic structures 41 can be shaped and sized to modulate the propagation of acoustic waves within the cavity 9. The acoustic structures 41 can be designed to condition the sound waves as they propagate through the cavity 9 to improve microphone performance. While the acoustic structures 41 may be formed of various shapes and in various locations, it should be appreciated that the acoustic structures 41 may be formed using the same 3D printing technique used to form the housing body 2. As explained below, various 3D printing techniques can be used to create arbitrary geometries in the housing body 2, including complex geometries that may be desirable for the acoustic structures 41. In addition, note that the sound port 7 of the package 1 shown in FIG. 1D can be formed through the package substrate 31 (or through the package lid 45 shown in FIG. 1C), rather than through the housing body 2, in some embodiments. In addition, as shown in FIG. 1D, the microphone die 33 and the processor die 35 may be mounted to an interior surface of the package substrate 31. The processor die 35 can electrically communicate with the package substrate 31 by way of the bonding wires 22. Internal traces of the package substrate 31 can in turn electrically connect the processor die 35 to the lead 37 on the outer surface of the package substrate 31.

FIG. 1E is a magnified side cross-sectional view of a sound port, such as the sound port 7 shown in the packages of FIGS. 1A-1C. In some embodiments, the sound port 7 may be a simple aperture formed through the housing body 2. However, in the embodiment of FIG. 1E, the sound port 7 can include various features that can be configured to filter out unwanted debris or to otherwise modulate the sound waves entering the package 1. For example, as shown in FIG. 1E, the sound port 7 can include one or more entrance port holes 55 formed through the outer surface of the housing body 2. Sound can enter the package through the entrance port holes 55. The sound port 7 can further comprise an acoustic cavity 57 that is formed within the base 5 of the housing body 2 and that is in fluid communication with the entrance port holes 55. In addition, one or more baffles 58 can be disposed within the acoustic cavity 57. The acoustic cavity 57 can also be in fluid communication with one or more exit port holes 59 formed through the interior surface of the housing body 2.

Sound waves (air) can therefore enter the package 1 by way of the entrance port holes 55. The sound waves can pass around the one or more baffles 58 within the acoustic cavity 57 and can enter the cavity 9 of the package 1 by way of the one or more exit port holes 59. As with the embodiments of FIGS. 1A-1D, the complex geometry associated with the sound port 7 shown in FIG. 1E can be formed using a 3D printing technique. The 3D printing methods disclosed herein can advantageously form these and other complex geometries using a wide variety of materials.

Figure 2:
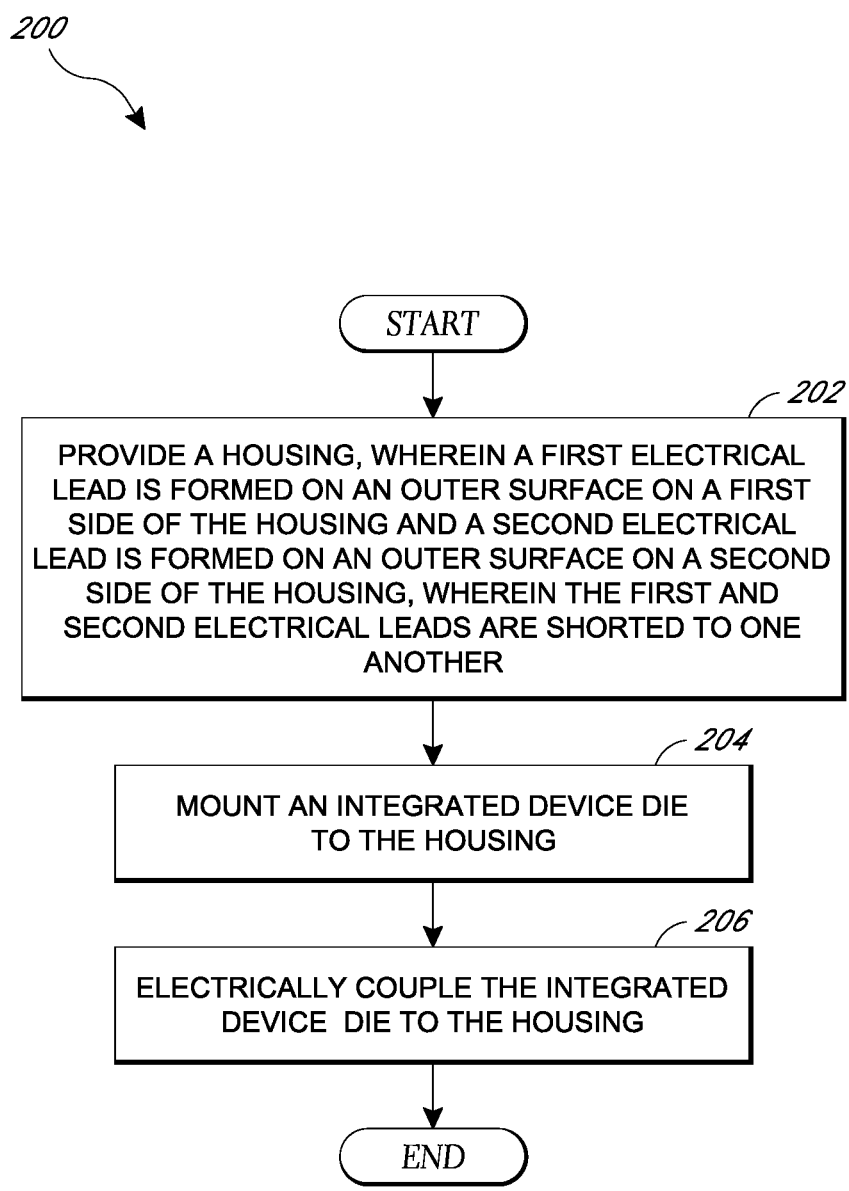
FIG. 2 is a flowchart illustrating one method for packaging an integrated device.

FIG. 2 is a flowchart illustrating one method 200 for packaging an integrated device. The method 200 can begin in a block 202 to provide a housing. The housing can include a base and a wall extending from the base. A first electrical lead can be formed on an outer surface on a first side of the housing. A second electrical lead can be formed on an outer surface on a second side of the housing. The first and second electrical leads can be shorted to one another. As explained above, the first and second leads can be shorted to one another by way of a wire extending through the base and the wall of the housing. The housing can include multiple pairs of such shorted first and second leads, such as, e.g., two pairs of shorted leads. The housing can also include a port for non-electrical communication (e.g., optical or acoustic communication). Because the first and second leads are shorted to one another, the package can be oriented and mounted as either a top or bottom port package. Further, an electrical interface can be formed on a distal end portion of the wall. In addition, an electrically conductive shielding layer can extend through the base and the wall. The base, the wall, the shielding layer, and the wire can be monolithically integrated.

The method can then turn to a block 204 to mount an integrated device die to the housing. The integrated device die can be a microphone device die in some embodiments. As explained with respect to FIGS. 1A-1D, the microphone device die can be a MEMS die in various arrangements. A processor die can also be mounted in the housing and can couple to the microphone die. Both the processor die and the microphone die can be mounted to an interior surface of the housing, including, e.g., the housing body or a substrate or lid that is coupled to the housing body. The package substrate or lid can be coupled to the distal end portion of the wall of the housing.

The method can include a block 206 to electrically couple the integrated device die to the housing. Where the integrated device die is a microphone die, the microphone die can electrically couple to a processor die, which in turn can electrically couple to the housing. In some arrangements, bonding wires can electrically connect the microphone die to the processor die and the processor die to the housing. The bonding wires can couple the processor die to an electrical contact pad on the housing, which is coupled to external leads by way of conductive wires or traces located within the housing. In a flip-chip arrangement, mounting at block 204 can be simultaneous with electrical coupling at block 206.

Advanced Packaging Techniques Using Three-Dimensional (3D) Printing

As explained above, it can be advantageous in advanced packaging techniques to be able to form complex and arbitrary geometries from a wide variety of materials, including conductors and non-conductors. One way to create such complex structures is by using various three-dimensional (3D) printing techniques. In general, 3D printing methods can be used to form complex geometries by building up the desired structure in a layer-by-layer approach. Advantageously, each layer can include bits of conductive material, bits of non-conductive or insulating material, and bits of sacrificial material configured to create cavities, recesses, and voids. Various 3D printing techniques can also be used to monolithically integrate these different types of materials such that conductors and non-conductors can be integrally formed into a continuous, unified structure.

For example, the desired 3D structure can be formed of tens, hundreds, or thousands of individual layers. Each layer can thereby form a thin slice, or cross-section, of the ultimate 3D structure. Any particular layer can be formed by applying discrete "bits" of material, such as dots or pixels of a material. In some arrangements, a particular layer can include bits of applied conductive material, non-conductive material, and sacrificial material. These materials can be applied to a support structure in any desired pattern to conform to the particular slice or cross-section of the desired 3D structure. For example, conductors and non-conductors can be applied in the desired pattern, such that the conductors can be embedded within, or applied to the surface of, the non-conducting materials. Bits of sacrificial material can be applied within a layer in spaces that will ultimately form a cavity, void, or recess in the final 3D structure. After applying a particular layer, in some embodiments, the particular layer can be temporarily unified or cured to ensure that the individual layers are structurally stable during manufacturing and that the applied layers can support the application of additional layers. Once all the layers have been applied, the entire structure can be subjected to various post-layering techniques to monolithically integrate the structure and to remove the sacrificial material to form internal cavities, voids, and recesses.

Figure 1F:
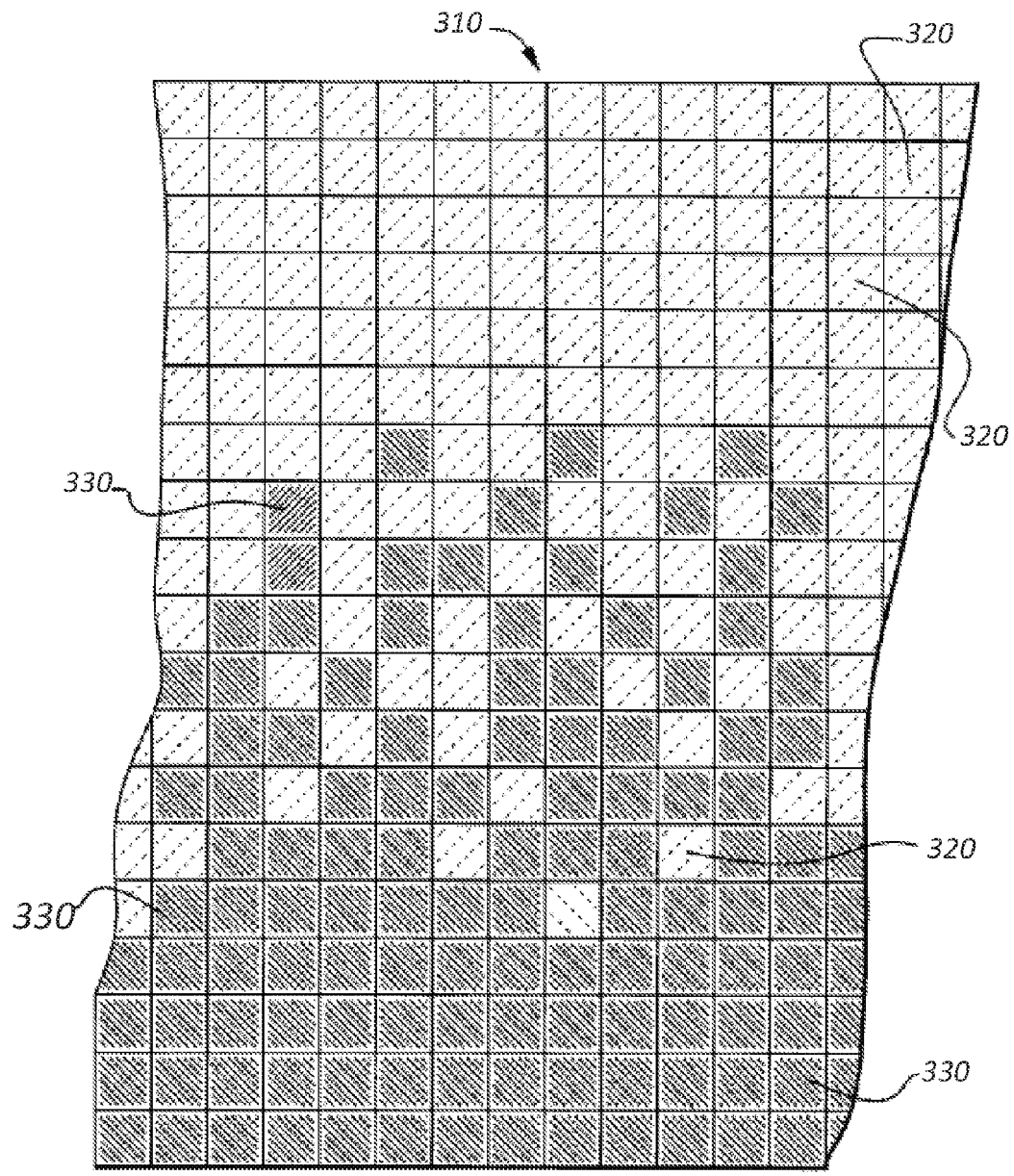
FIG 1F is a sectional view of a structure formed with a random pattern of micro-bricks of dis-similar materials occupying a boundary region with a concentration micro-brick distribution within the boundary region.

One example of a 3D printing technique is the layer-by-layer printing method employed by EoPlex Technologies, Inc., of Redwood City, Calif. (World Wide Web page eoplex.com). In the EoPlex process, each layer is applied by printing an ink or paste to a support structure. Each ink or paste can include various types of materials, such as metals, ceramics, or polymers. Sacrificial materials can also be applied within a layer in spaces that will ultimately form cavities, recesses, or voids. After applying a particular layer or material, for some arrangements, the layer can be temporarily cured or unified by way of, e.g., a ultraviolet (UV) or thermal curing process. Once all the layers have been applied, the structure can be monolithically integrated by one or more of sintering, polymerizing, drying, cofiring, bonding, fusing, debinderizing, heating and/or curing. The sacrificial material can be removed to form cavities, holes, voids, and/or recesses. The sacrificial material may be removed during the step that monolithically integrates the final 3D structure (e.g., removed during firing, debinderizing, and/or sintering, etc.); in other arrangements, the sacrificial material may be selectively removed by other means. Skilled artisans will appreciate that any suitable 3D printing technique may be used that is capable of printing conductors and insulators and forming cavities therein. For a more detailed explanation of example 3D printing methods, the following references are hereby incorporated by reference herein in their entirety and for all purposes: U.S. Pat. No. 7,255,551, entitled "HIGH VOLUME PRINT-FORMING SYSTEM," issued Aug. 14, 2007; U.S. Patent Publication No. 2010/0009133 A1, entitled "BOUNDARY CONFIGURATIONS FOR MULTI-MATERIAL PRINT-FORMING," published Jan. 14, 2010; U.S. Pat. No. 5,348,693, entitled "FORMATION OF THREE DIMENSIONAL OBJECTS AND ASSEMBLIES," issued Sep. 20, 1994. For example, as explained in paragraph [0050] of U.S. Patent Publication No. 2010/0009133 A1, and as shown in FIG. 1F, a structure 310 formed of two different materials can be formed such that the two materials come together at a boundary region with one of the materials comprising first micro-bricks 320 and one of the materials comprising second micro-bricks 330. The first micro-bricks 320 and second micro-bricks 330 are largely confined to separate regions adjacent each other at the boundary region. Within the boundary region, various different transitional schemes are employed to gradually transition from substantially only the first material to substantially only the second material. In this way, dissimilarities in the performance of the materials do not result in concentration of stresses and otherwise sharp differences in material performance at the boundary. Rather, any such stresses are dispersed so that less overall stress and propensity to failure or other undesirable performance is exhibited by the structure 310. Paragraph [0052] of U.S. Patent Publication No. 2010/0009133 A1 further explains that the term boundary can be described as a surface having two sides with one side occupied primarily by a first material and the other side occupied primarily by a second material. Thus, the boundary becomes that surface in space wherein half or more of the material on one side is comprised of the first material and half or more of the material on the second side of the boundary is comprised of the second material. The boundary region is defined as a region where the structure 310 is not entirely formed of the first material or the second material, but rather includes some mixture of the two materials together. This boundary region can have a very small thickness or can have a very wide thickness, depending on the design characteristics selected by a designer of the structure 310. Paragraph [0053] of U.S. Patent Publication No. 2010/0009133 A1 further explains that when employing such design to form the structure 310, the first and second materials are confined to micro-bricks 320, 330. First micro-brick 320 are provided which are formed substantially entirely of the first material only. Second micro-bricks 330 are provided which are formed substantially only of the second material. The drawings depict a simplest case where the multi-material print-formed structure 310 has two different materials. However, the structure 310 could have three or more different materials with micro-bricks formed of three or more different materials.

As explained above, 3D printing techniques can be used with a variety of materials, including metals, ceramics, glasses, dielectrics, and polymers. For example, during processing of a conductive material, inks or pastes can be used as a carrier of the conductors and non-conductors, which may in powdered form in some arrangements. In various embodiments, for example, inks can carry powders or resins that can include conductors such as steel, stainless steel, silver, and any other suitable metal. For example, an epoxy acrylate resin can contain a desired volume of stainless steel powder (e.g., about 50% by volume of stainless steel). The sacrificial material can be any suitable material, including resins such as polyurethane acrylate. The resin can include boron nitride powder (e.g., about 20%). In some embodiments, any suitable conductor and/or non-conductor can be used within a 3D printed structure. For example, in some arrangements, any set of materials can be used that has similar sintering and/or firing characteristics, e.g., similar sintering temperatures. In some arrangements, it can also be important to select materials that have compatible thermal expansion properties.

It should be appreciated that 3D printing techniques can have several advantages when compared to other manufacturing techniques such as molding. While molding can be an effective technique for mass-producing structures in some situations, conventional molding methods may not be suitable for forming the complex geometries and cavities that can be formed using 3D printing techniques. Moreover, molding cannot readily integrate disparate materials. By contrast, 3D printing methods can readily form cavities and complex shapes, including disparate materials, using a layer-by-layer approach.

Building a Reversible Microphone Package Using 3D Printing Techniques

Figure 3A:
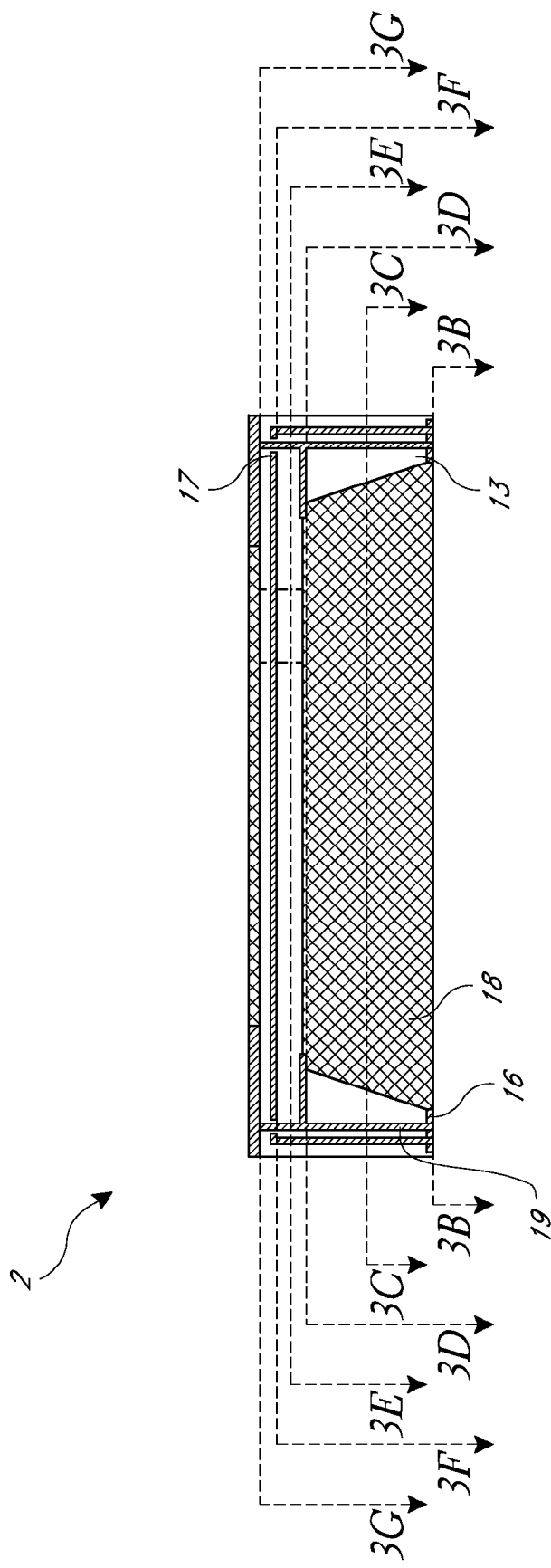
FIG. 3A is a side cross-sectional view of a housing body for the reversible top and bottom port microphone package shown in FIGS. 1A and 1B.

Part or all of the reversible microphone package 1 disclosed above in FIGS. 1A-1E may be formed using a suitable 3D printing technique. For example, the housing body 2 may be built up layer-by-layer to form the internal conductors, cavities, and other features shown in FIGS. 1A-1E. FIG. 3A is a side cross-sectional view of the housing body 2 of the reversible top and bottom port package 1 shown in FIGS. 1A and 1B. As explained below, the housing body 2 can be formed of an insulating material or insulator 13, a wire conductor 19, a shielding conductor 17, a sacrificial material 18, and an interface conductor 16. Thus, FIG. 3A illustrates the housing body 2 before removal of the sacrificial material 18. FIGS. 3B-3G are cross-sectional views of the housing shown in FIG. 3A, which can also represent plan views at various stages of a three-dimensional (3D) printing technique. Thus, each cross-section shown in FIGS. 3B-3G can represent a cross-section of the finished housing body 2 (before removal of the sacrificial material 18) and the pattern that is applied during the 3D printing process.

For example, FIG. 3B is a cross-section of the housing body 2 that illustrates the bottom layer of the body 2. The cross-section of the finished housing body 2 includes a rectangular (although other shapes are suitable) non-conductive wall 10 extending about a perimeter of the housing body 2. In FIG. 3B, the perimeter of the wall 10 is represented by the insulating material, or insulator 13, that can be applied in a pattern corresponding to the distal end of the wall 10 shown in FIGS. 1A-1D. As explained above, the insulator 13 can be applied or written to a support substrate or structure in multiple bits of non-conductive material. For example, in some arrangements, the bits (whether conductive, insulating or sacrificial) can be applied using a screen-printing technique. Other ways of applying the bits may also be suitable.

As shown in FIGS. 1A-1D, the electrical interface 14 can be formed at the distal end of the wall 10, e.g., at the bottom of the housing body 2 shown in FIG. 3A, at locations configured to correspond to conductive lands or contacts on the system substrate 12 (e.g., the system motherboard) or on the package substrate 31. In the cross-section of FIG. 3B, the interface 14 can be formed by applying bits of the interface conductor 16, which can be, e.g., any suitable conductor such as any suitable metal. As shown in FIG. 3B, the interface conductor 16 can be applied in four locations at the perimeter of the insulator 13 (e.g., the distal portion of the wall 10). It should be appreciated that the electrical interface 14, and the associated applied interface conductor 16, can be applied in any other suitable pattern and can include more than four applied locations. The figures show a simple configuration with four leads for purposes of illustration.

The sacrificial material 18 can be applied in a central region of the layer shown in FIG. 3B. As can be appreciated from FIG. 3A, a bottom view of the housing body 2 at the illustrated FIG. 3B cross-section includes the sacrificial material 18 that can be removed to form a recess in the housing body 2, which when assembled with the package substrate 31 or the package lid 45, can ultimately form the cavity 9 in the package 1. As explained above, the sacrificial material can be removed (e.g., burned away) after all the layers have been applied to the finished 3D structure. Thus, after the layering process, the sacrificial material 18 can be removed to form the recess in the housing body 2 that will ultimately form the cavity 9.

Figure 3D:
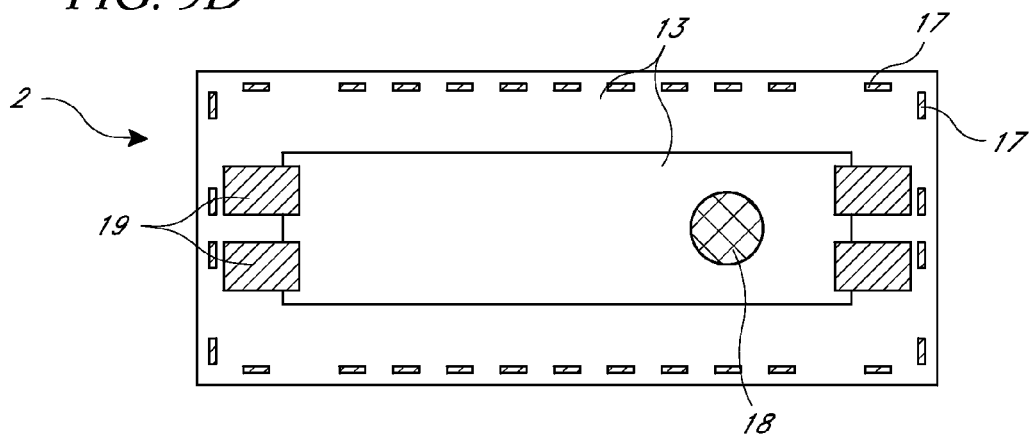
Figure 3E:
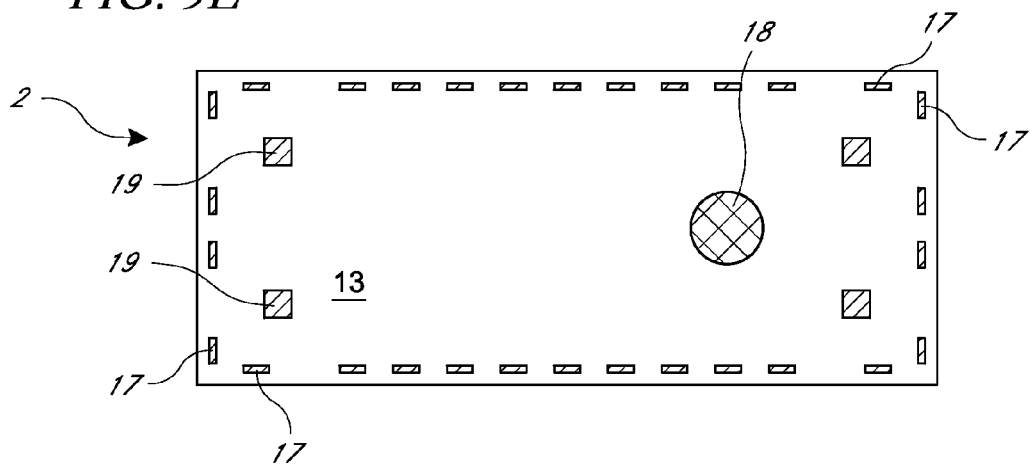
Figures 1, 3F:
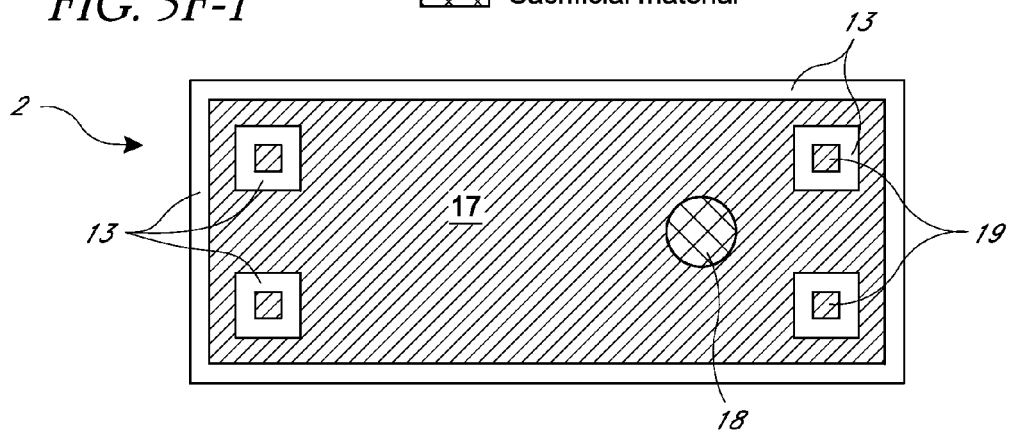
Figures 2, 3F:
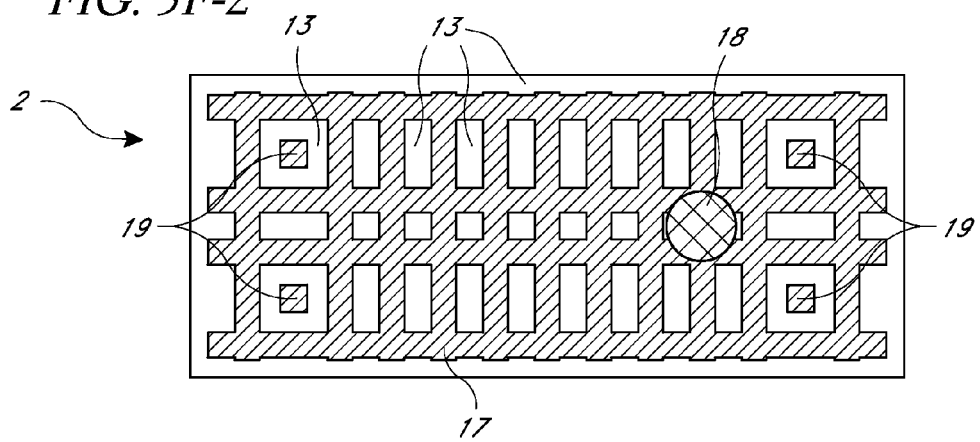

Turning to FIGS. 3C-1 and 3C-2, the illustrated cross-section depicts the deposited wire conductor 19 and the deposited shielding conductor 17 embedded in the insulator 13. As shown in FIGS. 1A-1D and 3A, the wire conductor 19 can ultimately be formed into the conductive wire 15 shown in FIGS. 1A-1D, while the shielding conductor 17 can ultimately be formed into the conductive shielding layer 11 shown in FIGS. 1A-1D. As in FIG. 3B, the sacrificial material 18 can be applied in spaces that will ultimately form the recess in the housing body 2 that will form the cavity 9 of the package 1.

The shielding layer 11 of FIGS. 1A-1D can be applied as a continuous conductive sheet or as a mesh in various embodiments. FIG. 3C-1 shows a cross-section of a shielding conductor 17 that can ultimately be formed into a continuous shielding layer 11. As shown in FIG. 3C-1, the shielding conductor 17 forms a continuous ring around the perimeter of the housing body 2. The shielding conductor 17 of FIG. 3C-1 can therefore extend up the wall 10 of the housing body 2 to form a continuous shielding sheet 11. Note that, as shown in FIGS. 1A-1D, the shielding layer 11 may include openings at various locations within the housing body 2 to allow the wire 15 to pass through.

FIGS. 3C-2 is a cross-section of a shielding conductor 17 that can ultimately be formed into a mesh shielding layer 11. Thus, the illustrated cross-section can include multiple conductive segments spaced apart from one another. As the segments of the shielding conductor 17 extend up the wall 10 and through the base 5, a mesh can be formed to shield the package 1 from EMI. Although not illustrated, the wall can additionally include horizontal conductive segments that cross the illustrated vertical conductive segments. It should be appreciated that, while the disclosure herein describes shielding conductors, wire conductors, interface conductors, etc., these applied conductive layers may be formed from the same material. The different references to these components are for ease of illustration only.

FIG. 3D is a cross-section taken along a surface of the base 5 of the housing body 2 that will ultimately form an interior surface of the housing body 2. As shown in FIG. 3D, the wire conductor 19 can be applied in a pattern that will ultimately form the electrical contact pads 21 shown in FIGS. 1A-1D. The insulator 13 can be applied along the perimeter of the housing body 2, e.g., the base, and to the portion of the body 2 that will become the base 5. In addition, the shielding conductor 17 is illustrated, similar to that disclosed in FIG. 3C-2, e.g., in a mesh configuration. The sacrificial material 18 can be applied in a pattern that corresponds to the port 7 formed in the final housing body 2. After the layering process is completed, the sacrificial material 18 can be selectively removed to form the port 7. In addition, though not illustrated in FIG. 3D, various filtering and/or acoustic features can be formed in the port 7, such as those shown in FIG. 1E. For example, the baffle 58 and acoustic cavity 57 can be formed in the sound port 7 by patterning the appropriate layer with the insulator 13 and the sacrificial material 18.

Turning to FIG. 3E, a cross-section of the housing body 2 taken along the insulating portion of the base 5 is shown. In the cross-section of FIG. 3E, therefore, the shielding conductor 17 (again showing a mesh configuration) and the wire conductor 19 are shown as extending through the perimeter of the base 5 of the finished housing body 2. Further, the sacrificial material 18 can be applied within the insulator 13 in the space that will be formed as the sound port 7.

FIGS. 3F-1 and 3F-2 show cross-sections of the housing body 2 taken along the base 5 where the shielding layer 11 is ultimately formed. For example, in FIG. 3F-1, the shielding conductor 17 is shown as a continuous sheet having openings that allow the wire conductors 19 to pass therethrough. The insulator 13 can thereby electrically separate the shielding conductor 17 and the wire conductor 19 as the wire conductor 19 passes through the openings in the shielding conductor 17. In addition, the sacrificial material 18 can be applied within the shielding conductor 17.

The cross-section of FIG. 3F-2 shows a shielding conductor 17 patterned in a mesh configuration. The wire conductors 19 can pass through openings in the mesh formed by the conductive segments of the shielding conductor 17. As above, the sacrificial material 18 can be applied within the mesh to ultimately form the port 7.

Figure 3G:
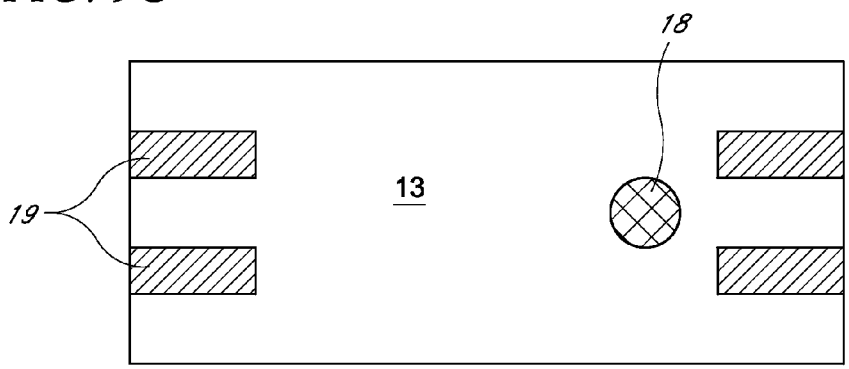

FIG. 3G is a cross-section taken along an outer surface of the housing body 2, e.g., along the outer surface of the base 5. At the illustrated outer surface, the wire conductor 19 can be applied within the insulator 13 in a pattern that will ultimately form the leads 25 on the outer surface of the housing body 2. Thus, as explained above, the wire conductor 19 can be applied in multiple layers to extend from the distal end of the wall 10 (e.g., the interface 14) to the leads 25. The layers of the wire conductor 19 and the shielding conductor 17 can be vertically aligned in the built-up layers such that the conductors form continuous conductive pathways. As above, the sacrificial material 18 can be applied in spaces that will ultimately form the port 7.

Figure 4A:
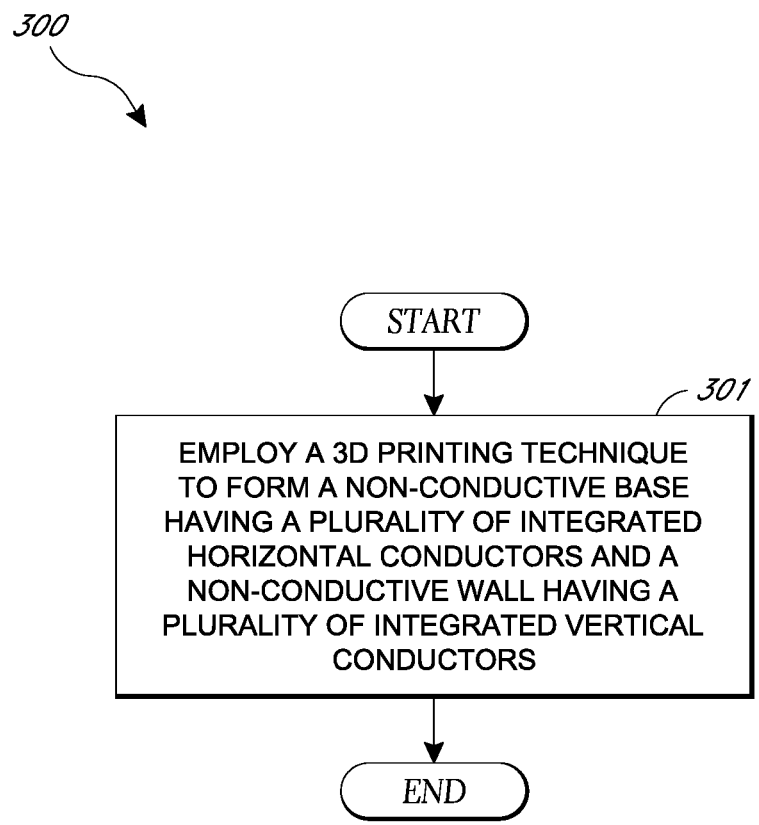
FIGS. 4A-4C are flowcharts illustrating various methods for forming an integrated device package.

Turning to FIG. 4A, a flowchart illustrates one method 300 for forming an integrated device package. As shown in a block 301, a 3D printing technique can be employed to form a non-conductive base having a plurality of integrated horizontal conductors and a non-conductive wall having a plurality of integrated vertical conductors. For example, as explained above with respect to FIGS. 1A-1D and 3A-3G, the base 5 can include horizontal conductors corresponding, e.g., to the shielding layer 11, the electrical contact pad 21, and/or the leads 25. Further, the wall 10 can include multiple vertical conductors, including, e.g., the shielding layer 11 and the wire 15.

Figure 4B:
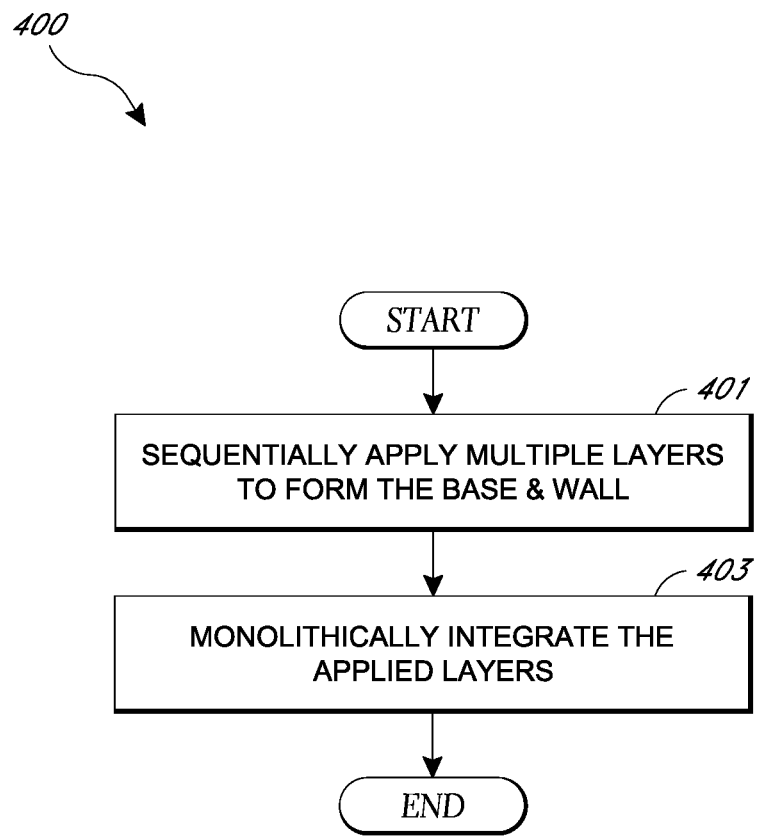

FIG. 4B illustrates a method 400 for forming an integrated device package. The method 400 can begin in a block 401 to sequentially apply multiple layers to form the base and the wall. As explained above, various 3D printing techniques can be used to form the base and the wall, including, e.g., methods used by EoPlex Technologies, Inc. Advantageously, a wide variety of materials can be used, including, e.g., metals, ceramics, polymers, dielectrics, glasses, etc.

The method can proceed to a block 403 wherein the applied layers can be monolithically integrated. Monolithically integrating the applied layers can finalize the 3D structure so that the final structure is a monolithically bonded and substantially continuous structure. The integration or consolidation can be performed using any suitable technique, such as by sintering, polymerizing, drying, cofiring, bonding, fusing, debinderizing, heating and/or curing. It should be appreciated that, while the monolithically integrated structure can be substantially continuous, there may nevertheless be voids or other discontinuities that can be caused by, e.g., shrinking of the material during the integration.

Figure 4C:
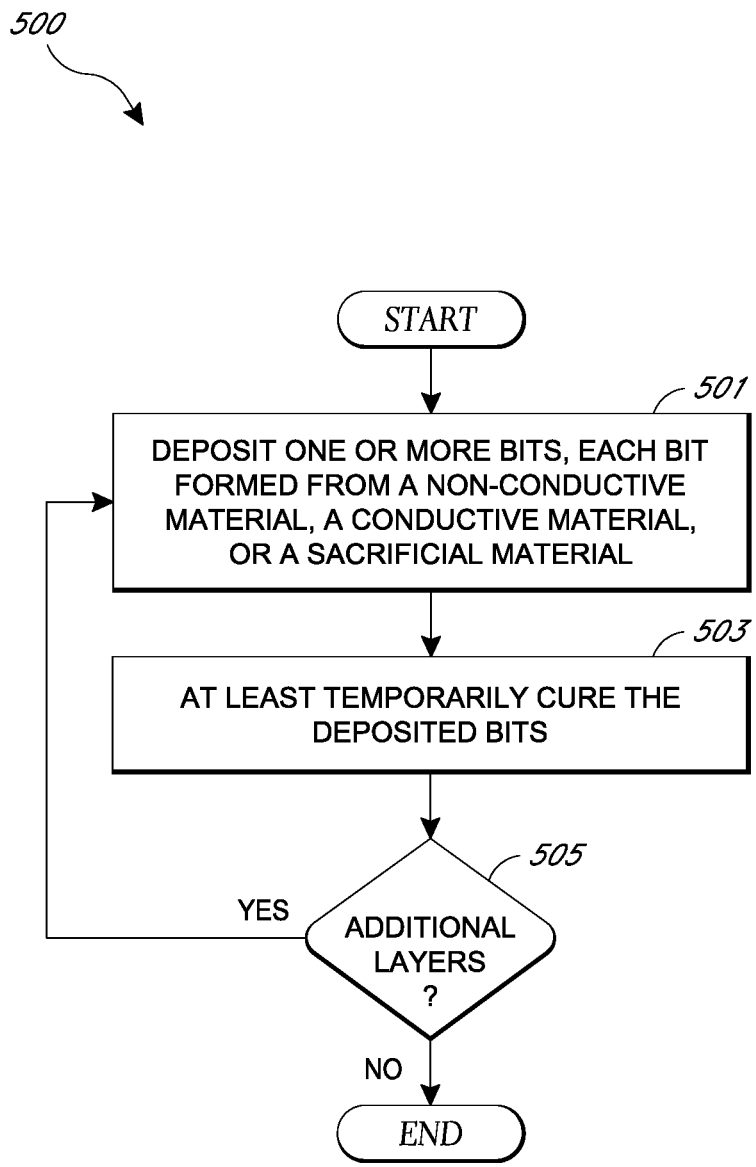

Turning to FIG. 4C, a flowchart is shown illustrating one method 500 for forming an integrated device package. The method can begin in a block 501 to deposit one or more bits, wherein each bit is formed from a non-conductive material, a conductive material, or a sacrificial material. As explained above, the bits can be applied using, e.g., printing techniques such as screen printing. The materials can include any suitable metal, ceramic, glass, polymer, dielectric, etc. Further, a sacrificial material can be applied in spaces that ultimately will be formed as a cavity, void, or recess.

Turning to a block 503, the applied layer, including the deposited bits, can be at least temporarily cured or unified.

The temporary curing step can at least temporarily stabilize the applied layer such that it can support the application of additional layers. For example, the at least temporary curing can be accomplished using, e.g., a UV and/or thermal curing process.

The method 500 can then proceed to a decision block 505 to determine whether additional layers are to be applied. If a decision is made in block 505 that additional layers are to be applied, then the method can proceed to the block 501, wherein one or more bits is deposited to form another layer. For embodiments that use vertical conductors, such as those disclosed in FIGS. 1A-1D, the conductive bits in the subsequent layer can be substantially vertically aligned with the conductive bits applied in the previous layer. Vertically aligning the conductive bits can serve to form a continuous conductive pathway through the vertical conductor(s). If a decision is made in block 505 that additional layers will not be applied, then the method 500 ends, and the final 3D structure will be formed through further processing, such as sintering.

Electret Condenser Microphones and Other Types of Packages

FIGS. 1A-1E, described above, illustrate one type of package according to various embodiments. For example, the packages disclosed in FIGS. 1A-1E can be employed with a MEMS microphone die. However, the techniques and packages disclosed herein need not be limited to MEMS microphones. Indeed, the packages disclosed herein can be used in any suitable package, including integrated circuit packages, MEMS packages, and other types of integrated devices.

For example, an electret condenser microphone (ECM) can be formed using 3D printing techniques. An ECM is a type of microphone that employs a charged material, e.g., an electret membrane, to convert sound waves to electrical signals that can be processed by a processor, e.g., an Application-Specific Integrated Circuit (ASIC) or other type of integrated circuit. The electret membrane can be a dielectric material or sheet having an embedded charge. Sound waves can cause the electret membrane to vibrate relative to a diaphragm, creating a changing capacitance or voltage that can be detected and processed by the processor. In various arrangements, the signal received from the electret membrane may be amplified before processing. For example, a junction gate field-effect transistor (JFET) may be used in some implementations to gain the signal. In other arrangements, more complex amplification and processing techniques may be performed in an ASIC.

FIG. 5A is a schematic, side cross-sectional view of an ECM package 60. The ECM package 60 can include an outer casing 61. The outer casing 61 can be formed of a conductor, such as any suitable metal. A conductive ring 62 or cylinder, which can be a metal, can be provided within the casing 61 to support various components of the ECM. For example, an electret membrane 68 can be coupled to the ring 62. In some embodiments, a spacer ring 70 can be applied around the periphery of the electret membrane 68. A diaphragm 71 can be coupled to the spacer ring 70 and can be spaced apart from the electret membrane 68. Sound waves entering the package 60 through a sound port 63 can cause the diaphragm 71 to vibrate relative to the electret membrane 68. The relative vibration between the diaphragm 71 and the electret membrane 68 can create a changing capacitance (or changing voltage) representative of the detected sound waves. The variable capacitance is shown in FIG. 5A as $C_{mic}$. The outer casing 61 can provide shielding from EMI, or RF interference, by acting as a Faraday cage.

Within the casing 61, a substrate 65 can support an ASIC 66. The ASIC 66 can be configured to process the analog signals generated by the electret membrane 68 and the diaphragm 71. Analog signals generated by the relative vibration of the electret membrane 68 and the diaphragm 71 can be transmitted to a first terminal 75 of the ASIC 66 by way of a first conductive pathway 69 provided by the conductive ring 62. Signals can pass through the ring 62 and can couple to the first terminal 75 by way of a conductive trace 64 formed in the substrate 65. The ASIC 66 can be coupled to a second terminal 77, which can be coupled to the conductive casing 61. In some embodiments, the second terminal 77 of the ASIC 66 can be grounded. For example, the conductive casing 61 can be grounded. In some embodiments, the casing 61 can provide a second conductive pathway 67 electrically connecting the second terminal 77 of the ASIC 66 to the diaphragm 71, as shown in FIG. 5A. The sound signals can be processed by the ASIC 66 by measuring the change in capacitance (or alternatively voltage) induced across the diaphragm 71 and the electret membrane 68 by sound waves entering the sound port 63.

In the package 60 of FIG. 5A, stray capacitance can degrade microphone performance. As shown in FIG. 5A, various portions of the package 60 can create undesirable stray capacitance, particularly in light of the large metallic structures used in the package 60. For example, a first stray capacitance, $C_{s1}$, can be created between the diaphragm 71 (or the membrane 68) and the conductive ring 62. Further, a second stray capacitance, $C_{s2}$, can be generated between the conductive ring 62 and the casing 61. A third stray capacitance, $C_{s3}$, can be created across the substrate 65, or between the traces 64 and a lower metallic surface of the package 60.

FIG. 5B is a schematic diagram of a circuit that is equivalent to the microphone package of FIG. 5A. As seen in FIG. 5B, the capacitance across the electret membrane 68 and the diaphragm 71, $C_{mic}$, is in parallel with the three stray capacitances induced as a result of the package construction, $C_{s1}$, $C_{s2}$, and $C_{s3}$. An approximation of the loss of sensitivity, L, in units of decibels relative to full scale (dBFS), due to stray capacitance can be represented by:

$$L = 20\log\left(\frac{C_{mic}}{C_{mic} + C_{s1} + C_{s2} + C_{s3}}\right).$$

In some arrangements, the total loss in sensitivity due to stray capacitance can be about 6 dBFS. Accordingly, it can be desirable to reduce stray capacitance in microphone packages.

Figure 5C:
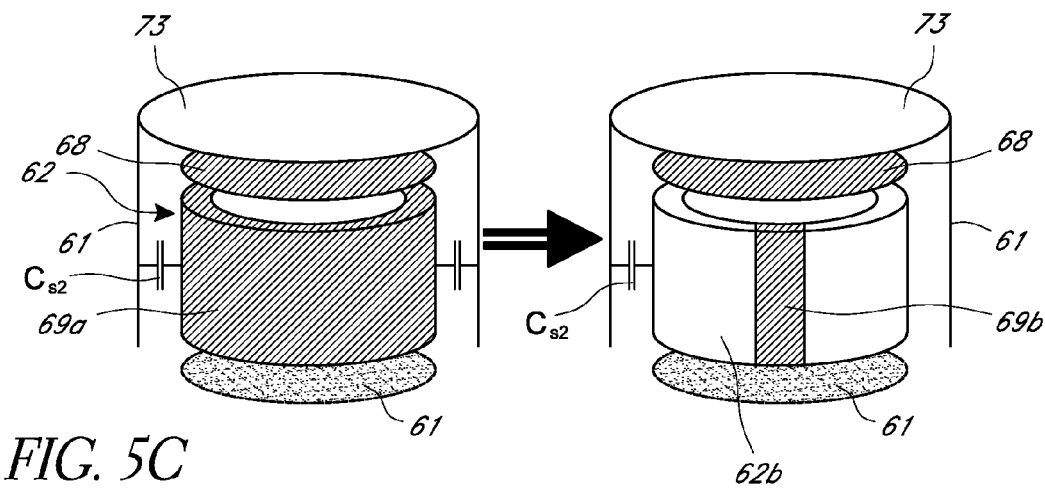
FIGS. 5C-5D are three-dimensional (3D) schematic, perspective views of various components of the microphone package of FIG. 5A.
Figure 5D:
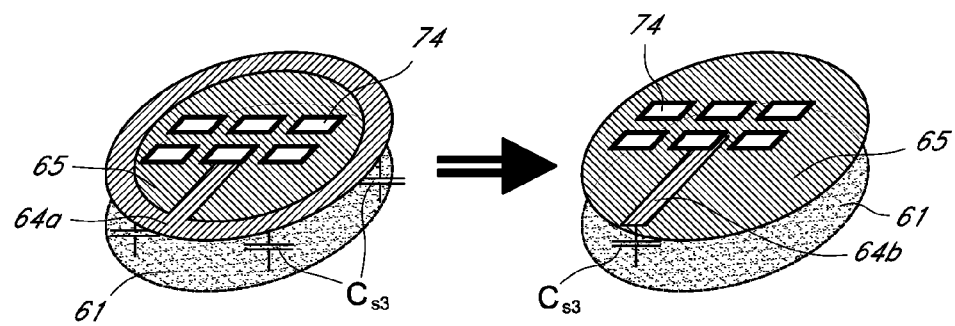

FIGS. 5C-5D are schematic, perspective views of various components of the microphone package of FIG. 5A. FIGS. 5C-5D illustrate in detail potential sources of stray capacitance and ways of reducing it. For example, in FIG. 5C, the second stray capacitance, $C_{s2}$, induced between the casing 61 and the conductive ring 62 is shown. In a conventional package (shown on the left in FIG. 5C), the conductive ring 62 is a cylindrical body that provides a first conductive pathway 69a. Because the conductive pathway 69a comprises the entirety of a hollow cylindrical ring 62, having a large surface, the second stray capacitance, $C_{s2}$, can be disadvantageously large. One way to reduce the second stray capacitance, $C_{s2}$, and thereby maintain the sensitivity of the microphone, is to reduce the conductive surface of the conductive ring 62. Thus, in the diagram on the right of FIG. 5C, the ring can include a thin conductive pathway 69b and the rest of the ring 62b can be formed of insulating material.

Because the ring on the right side of FIG. 5C includes a thinner conductive pathway 69b surrounded by insulating material, the stray capacitance, $C_{s2}$, can thereby be reduced.

FIG. 5D illustrates a schematic view of the substrate 65 and a bottom surface of the outer casing 61. As shown in the diagram on the left in FIG. 5D, the substrate 65 can include a plurality of contact pads 74 and the conductive trace 64a that electrically couples the ring 62 to the ASIC 66 by way of the pads 74 on the substrate 65. In the diagram on the left side of FIG. 5D, the trace 64a includes a complete annular ring. The complete annulus creates a large surface area that generates the third stray capacitance, $C_{s3}$. By contrast, the trace 64b on the right side of FIG. 5D is thinner than the trace 64a, and because the trace 64b has a smaller area than the trace 64a, the stray capacitance, $C_{s3}$, can thereby be reduced in the diagram on the right side of FIG. 5D.

Accordingly, it can be advantageous to reduce stray capacitance in ECM packages and to generally improve the packaging thereof.

One embodiment of an ECM package 160 is shown in the exploded, cross-sectional side view of FIG. 6A and in the assembled, cross-sectional side view of FIG. 6B. The package 160 can include a first housing 102a and a second housing 102b. The first housing 102a can include a base 105 and a wall 110 integral with and extending from the base 105 at a proximal end. A first wire 169 can extend from the base 105 to a distal end portion of the wall 110, and a second wire 167a can extend from the base 105 to the distal end portion of the wall 110. The first housing 102a can further include one or more leads 114 formed on an outer surface of the first housing 102a configured to couple to a system board. In addition, in various embodiments, a conductive shielding layer 111a can be formed within the base 105 and wall 110 to shield the package 160 from RF interference. A processor die 166, such as an ASIC, can couple to the first housing 102a by way of bonding wires 122, as shown, or flip-chip connections.

The second housing 102b can include a sound port 163 configured to allow sound waves to pass therethrough. A third wire 167b can extend from an interior surface of the second housing 102b through the housing 102b and can be exposed at a distal end of a wall formed in the second housing 102b. Furthermore, the second housing 102b can include a conductive shielding layer 111b that is complementary to the conductive shielding layer 111a formed in the first housing 102a.

The package 160 can also include an electret membrane 168, a spacer ring 170, and a diaphragm 171, similar to those described above with respect to FIG. 5A. The first housing 102a and the second housing 102b can be coupled together to form a single housing 102 (FIG. 6B). In some implementations, for example, the first housing 102a can be adhered to the second housing 102b. Coupling the first housing 102a to the second housing 102b can secure the electret membrane 168 to a ledge 142 formed in the distal end portion of the wall 110. The spacer ring 170 can be coupled to the electret membrane 168, and the diaphragm 171 can be coupled to the spacer ring 170.

The first wire 169 can provide electrical communication between the electret membrane 168 and the processor die 166 to provide an input from the microphone to the processor die 166. For example, the first wire 169 can electrically couple to a terminal of the processor die 166 by way of conductive trace 164. The second wire 167a and the third wire 167b can be aligned such that they can electrically couple to one another when the first housing 102a and the second housing 102b are coupled together. Thus, the first and second wires 167a, 167b can provide electrical communication between a terminal of the processor die 166 and the diaphragm 171. In some implementations, the diaphragm 171 can be grounded, and sound signals can be measured by measuring the changing capacitance or voltage across the diaphragm 171 and the electret membrane 168. Further the shielding layer 111a of the first housing 102a can be substantially aligned with the shielding layer 111b of the second housing 102b such that when the first and second housings 102a, 102b are coupled, the shielding layers 111a, 111b can form a single shielding layer 111 (FIG. 6B). As in the above-described embodiments, the first and second housings 102a and 102b can be formed using a suitable 3D printing technique. As compared with conventional manufacturing techniques, 3D printing methods can be used to form the cavities, recesses, and embedded conductors shown in FIGS. 6A-6B.

Compared to the ECM package 60 of FIG. 5A, the package 160 of FIGS. 6A-6B can advantageously reduce stray capacitance in the microphone package. For example, the conductive pathway, e.g., the first wire 169, connecting the electret membrane 168 to the processor die 166 can be made substantially thinner than the cylindrical ring 62 that provides the conductive pathway 69 in the arrangement of FIG. 5A. Because a full cylindrical, conductive ring is not employed in the implementation of FIGS. 6A-6B, the second stray capacitance, $C_{s2}$, can thereby be reduced. Furthermore, the conductive trace 164 can be formed as a thin conductive wire segment, as opposed to the annular ring of the trace 64 of FIG. 5A. Because the trace 164 of FIG. 6A-6B can be made thinner than the trace 64 of FIG. 5A, the third stray capacitance, $C_{s3}$, can also be reduced. By forming thinner metallic interconnects, the implementations of FIGS. 6A-6B can provide for improved microphone sensitivity as compared to the arrangement of FIG. 5A.

Figure 6C:
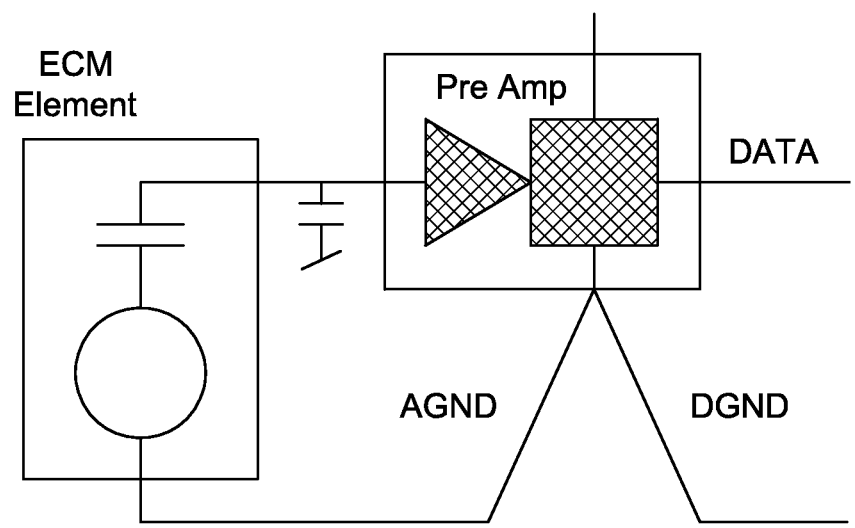
FIG. 6C is a schematic diagram of a circuit that is equivalent to the microphone package of FIGS. 6A and 6B.

FIG. 6C is a schematic diagram of a circuit that is equivalent to the microphone package of FIGS. 6A and 6B. The ECM element, including the electret membrane and the diaphragm, can be in series with the ASIC or processor die, which can include a pre-amp. In the diagram of FIG. 6C, the processor die can include both a digital ground and an analog ground, due to the construction of the package 160 and the housing 102.

Thus, various integrated devices can be packaged in housings formed by 3D printing techniques. For example, horizontal and vertical conductors can be monolithically integrated into the housing body of the package. The integrated conductors can act as signal wires and/or as shielding to protect the package from undesirable EMI, or RF interference. In addition, for microphone applications, cavities and complex acoustic structures can be formed within the housing to modulate the sound waves entering the package. Further, acoustic structures, such as baffles, and acoustic cavities can be formed within the port of the package to filter debris from the package and to further condition the sound waves. In addition, conductors and cavities can be formed using 3D printing techniques for various embodiments of an ECM package. By reducing the width of the conductors, stray capacitance in ECM packages can be reduced, and the sensitivity of the microphone package can be improved. It should be appreciated, however, that other types of packages, such as IC packages and other types of MEMS packages, can similarly utilize the disclosed housings that include embedded, and integrated, vertical and/or horizontal conductors, in addition to the various cavities and voids formed in the disclosed housings. The disclosed methods and apparatus have particular utility for packaging sensor or emitter devices that can benefit from a port for non-electrical (e.g., gas, acoustic, optical) communication, and from the flexibility afforded by the techniques and package structures disclosed herein.

Applications

Devices employing the above described schemes can be implemented into various electronic devices. Examples of the electronic devices can include, but are not limited to, consumer electronic products, parts of the consumer electronic products, electronic test equipment, etc. Examples of electronic products can include, but are not limited to, a mobile phone, a telephone, a computer, a hand-held computer, a personal digital assistant (PDA), an automobile, a multi-functional peripheral device, medical devices (such as hearing aids), etc. Further, the electronic device can include unfinished products.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An integrated device package comprising:
    a housing defining a cavity, the housing comprising:
        a non-conductive base;
        a non-conductive wall extending from the non-conductive base at an angle to at least partially define the cavity; and
        a conductor monolithically integrated with the non-conductive base and the non-conductive wall, the conductor extending along the non-conductive base and along the non-conductive wall, wherein the conductor comprises a first material and the non-conductive base comprises a second material, wherein the conductor and the non-conductive base are joined along a boundary surface such that portions of the first material are mixed together with portions of the second material, wherein the conductor and the non-conductive base are joined along the boundary surface such that most of the first material is disposed on a first side of the boundary surface and most of the second material is disposed on a second side of the boundary surface, and wherein a portion of the second material is disposed on the first side of the boundary surface;
    an integrated device die mounted to and electrically connected to the housing, the integrated device die disposed in the cavity; and
    an electrical lead disposed on an outer surface of the housing.

2. The package of claim 1, wherein the housing comprises a lid mounted to the wall to enclose the integrated device die in the cavity of the housing.

3. The package of claim 1, wherein the integrated device die comprises a processor die or a microphone die.

4. The package of claim 1, wherein the integrated device die comprises a vibrating diaphragm.

5. The package of claim 1, wherein the conductor comprises a portion of a conductive shielding layer.

6. The package of claim 5, wherein the conductive shielding layer comprises a mesh.

7. The package of claim 1, wherein the base and the wall are monolithically integrated.

8. The package of claim 1, further comprising a second conductor monolithically integrated with the wall.

9. The package of claim 1, wherein the electrical lead is monolithically integrated with the base.

10. The package of claim 1, further comprising a port through the housing to allow fluid to enter the cavity, wherein a side cross-sectional profile of the port varies through a thickness of the housing.

11. The package of claim 10, wherein the port comprises one or more port holes, the one or more port holes comprising a plurality of entrance port holes disposed through the outer surface of the housing and one or more exit port holes disposed through an inner surface of the housing.

12. The package of claim 11, wherein the port comprises a port cavity between the outer and inner surfaces of the housing, the port cavity wider than each port hole of the one or more port holes.

13. The package of claim 12, further comprising one or more baffles disposed within the port cavity.

14. The package of claim 10, further comprising an electrode on an inner surface of the housing such that the electrode is exposed to the cavity of the housing.

15. The package of claim 1, wherein the conductor comprises a metal.

16. The package of claim 1, wherein the package comprises an electret condenser microphone.

17. The package of claim 1,
    wherein the conductor is monolithically integrated with the non-conductive base by a three-dimensional (3D) printing technique.

18. The package of claim 17, wherein the non-conductive base and the non-conductive wall are monolithically integrated by the 3D printing technique.

19. An integrated device package comprising:
    a housing defining a cavity, the housing comprising:
        a non-conductive base;
        a non-conductive wall extending from the non-conductive base at an angle to at least partially define the cavity; and
        a conductor monolithically integrated with the non-conductive wall and the non-conductive base, the conductor extending along the non-conductive base and along the non-conductive wall, wherein the conductor comprises a first material and the non-conductive wall comprises a second material, wherein the conductor and the non-conductive wall are joined along a boundary surface such that portions of the first material are mixed together with portions of the second material, wherein the conductor and the non-conductive wall are joined along the boundary surface such that most of the first material is disposed on a first side of the boundary surface and most of the second material is disposed on a second side of the boundary surface, and wherein a portion of the second material is disposed on the first side of the boundary surface;

an integrated device die mounted to and electrically connected to the housing, the integrated device die disposed in the cavity; and an electrical lead disposed on an outer surface of the housing.

20. The package of claim 19, wherein the conductor is monolithically integrated with the non-conductive base.

* * * * *